United States Patent
Gamini

(10) Patent No.: US 10,636,780 B2
(45) Date of Patent: Apr. 28, 2020

(54) LAMINATED INTERPOSERS AND PACKAGES WITH EMBEDDED TRACE INTERCONNECTS

(71) Applicant: Invensas Corporation, San Jose, CA (US)

(72) Inventor: Nader Gamini, Cupertino, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 16/197,008

(22) Filed: Nov. 20, 2018

(65) Prior Publication Data

US 2019/0088636 A1    Mar. 21, 2019

Related U.S. Application Data

(63) Continuation of application No. 15/187,739, filed on Jun. 20, 2016, now Pat. No. 10,283,492.
(Continued)

(51) Int. Cl.
*H01L 25/18* (2006.01)
*H01L 21/48* (2006.01)
(Continued)

(52) U.S. Cl.
CPC ............ *H01L 25/18* (2013.01); *H01L 21/481* (2013.01); *H01L 21/486* (2013.01); *H01L 21/4857* (2013.01); *H01L 23/49827* (2013.01); *H01L 23/49838* (2013.01); *H01L 23/552* (2013.01); *H01L 25/0652* (2013.01); *H01L 25/105* (2013.01); *H01L 25/50* (2013.01);
(Continued)

(58) Field of Classification Search
CPC ...................................................... G01R 31/02

USPC .......................................................... 174/520
See application file for complete search history.

(56) References Cited

U.S. PATENT DOCUMENTS

| 4,624,896 A | 11/1986 | Watanabe et al. |
| 5,300,163 A | 4/1994 | Ohtaki |

(Continued)

FOREIGN PATENT DOCUMENTS

EP    1 688 995 A1    8/2006

OTHER PUBLICATIONS

B-Stage Epoxy, Epoxy Technology Inc., 2 pages, 2012.
(Continued)

*Primary Examiner* — Stanley Tso

(57) ABSTRACT

Laminated interposers and packages, with embedded trace interconnects are provided. An example process for making an interposer or package achieves vertical conductive vias in the package by depositing conductive traces on multiple wafers or panes, then laminating these substrates into a stack, thereby embedding the conductive traces. The laminated stack is sliced to dimensions of an interposer or electronic package. A side of the sliced stack is then used as the top of the interposer or package, rendering some of the horizontally laid traces into vertical conductive vias. The interposer or package can be finished or developed by adding redistribution layers on the top and bottom surfaces, and active and passive components. Electronic components can also be embedded in the laminated stack. Some of the stack layers can be active dies, such as memory controllers, memory storage arrays, and processors, to form a memory subsystem or self-contained computing device.

8 Claims, 25 Drawing Sheets

Related U.S. Application Data

(60) Provisional application No. 62/194,753, filed on Jul. 20, 2015, provisional application No. 62/183,692, filed on Jun. 23, 2015.

(51) Int. Cl.

| | |
|---|---|
| *H01L 23/498* | (2006.01) |
| *H01L 25/065* | (2006.01) |
| *H01L 23/552* | (2006.01) |
| *H01L 25/10* | (2006.01) |
| *H01L 25/00* | (2006.01) |
| H01L 23/66 | (2006.01) |
| H01L 23/36 | (2006.01) |
| H05K 1/03 | (2006.01) |
| H05K 1/18 | (2006.01) |
| H01L 25/16 | (2006.01) |

(52) U.S. Cl.
CPC ........ *H01L 23/36* (2013.01); *H01L 23/49805* (2013.01); *H01L 23/49822* (2013.01); *H01L 23/66* (2013.01); *H01L 25/0655* (2013.01); *H01L 25/16* (2013.01); *H01L 2223/6677* (2013.01); *H01L 2224/16227* (2013.01); *H01L 2225/1023* (2013.01); *H01L 2225/1064* (2013.01); *H01L 2225/1094* (2013.01); *H01L 2924/14* (2013.01); *H01L 2924/143* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/15153* (2013.01); *H01L 2924/15192* (2013.01); *H01L 2924/15311* (2013.01); *H01L 2924/19041* (2013.01); *H01L 2924/19042* (2013.01); *H01L 2924/19105* (2013.01); *H01L 2924/3025* (2013.01); *H05K 1/0306* (2013.01); *H05K 1/186* (2013.01); *H05K 2201/10378* (2013.01); *H05K 2203/0235* (2013.01)

(56) References Cited

U.S. PATENT DOCUMENTS

| | | | |
|---|---|---|---|
| 5,953,816 A | 9/1999 | Pai et al. | |
| 6,555,920 B2 | 4/2003 | Chee-Yee et al. | |
| 6,943,108 B2 | 9/2005 | Farooq et al. | |
| 6,970,362 B1* | 11/2005 | Chakravorty | H01L 23/50 257/E23.079 |
| 7,047,637 B2 | 5/2006 | deRochemont et al. | |
| 7,339,798 B2 | 3/2008 | Chakravorty | |
| 7,402,901 B2 | 7/2008 | Hatano et al. | |
| 7,504,271 B2 | 3/2009 | Palanduz | |
| 7,663,206 B2 | 2/2010 | Lee | |
| 7,675,160 B2 | 3/2010 | Dattaguru et al. | |
| 7,833,370 B2 | 11/2010 | Kawamura et al. | |
| 7,964,802 B2 | 6/2011 | Hoffmann et al. | |
| 8,064,224 B2 | 11/2011 | Mahajan et al. | |
| 8,274,149 B2 | 9/2012 | Chang et al. | |
| 8,274,165 B2 | 9/2012 | Sasaki et al. | |
| 8,384,411 B2 | 2/2013 | Mooyman-Beck et al. | |
| 8,435,373 B2 | 5/2013 | Slafer | |
| 8,435,573 B2 | 5/2013 | Slafer | |
| 8,633,858 B2 | 1/2014 | Nair et al. | |
| 8,686,548 B2 | 4/2014 | Arai | |
| 8,723,332 B2 | 5/2014 | McElrea et al. | |
| 8,901,748 B2 | 12/2014 | Manusharow et al. | |
| 8,946,900 B2 | 2/2015 | Qian et al. | |
| 8,963,013 B2 | 2/2015 | Beroz | |
| 8,988,895 B2 | 3/2015 | Mohammed et al. | |
| 9,119,313 B2 | 4/2015 | Zhang et al. | |
| 9,070,674 B2 | 6/2015 | Gallegos et al. | |
| 9,111,902 B2 | 8/2015 | Savastiouk et al. | |
| 9,147,663 B2 | 9/2015 | Liu et al. | |
| 9,236,366 B2 | 1/2016 | Roy et al. | |
| 9,312,175 B2 | 4/2016 | Haba et al. | |
| 9,349,663 B2 | 5/2016 | Chen et al. | |
| 9,368,425 B2 | 6/2016 | Graf et al. | |
| 9,368,450 B1 | 6/2016 | Gu et al. | |
| 9,374,896 B2 | 6/2016 | Chen et al. | |
| 9,406,532 B2 | 8/2016 | Haba et al. | |
| 9,433,077 B2 | 8/2016 | Brunschwiler et al. | |
| 9,508,636 B2 | 11/2016 | Zhang et al. | |
| 9,633,872 B2 | 4/2017 | Chen et al. | |
| 9,642,259 B2 | 5/2017 | Kim et al. | |
| 9,713,264 B2 | 7/2017 | Rawlings et al. | |
| 10,269,747 B2* | 4/2019 | Lei | H01L 24/03 |
| 2004/0256715 A1 | 12/2004 | Seki | |
| 2007/0004229 A1 | 1/2007 | Malajovich | |
| 2007/0296090 A1* | 12/2007 | Hembree | G01R 1/07314 257/784 |
| 2009/0068790 A1 | 3/2009 | Caskey et al. | |
| 2011/0148447 A1 | 6/2011 | Yoo et al. | |
| 2012/0211878 A1* | 8/2012 | Popovic | H01L 24/05 257/690 |
| 2013/0050228 A1* | 2/2013 | Petersen | H01L 23/053 345/501 |
| 2016/0212862 A1 | 7/2016 | Rathbum | |
| 2016/0260688 A1* | 9/2016 | Deshpande | H01L 21/52 |
| 2020/0009844 A1 | 1/2020 | Yu et al. | |

OTHER PUBLICATIONS

Ceramic, http://en.wikipedia.org/wiki/Ceramic, 7 pages, retrieved on Jul. 25, 2014.
Ceramic Engineering, http://en.wikipedia.org/wiki/Ceramic_engineering, 18 pages, retrieved on Jul. 25, 2014.
Ceramic Materials, http://en.wikipedia.org/wiki/Ceramic_materials, 11 pages, retrieved on Jul. 25, 2014.
Haavind, B., "Big Push Coming on Two Routes to 3D," Solid State Technology, http://elecroeq.com/blog/2007/07/big-push-coming-on-two-routes-to-3D, retrieved on Oct. 31, 2014.
International Search Report and Written Opinion for PCT/US2015/058861, dated Feb. 5, 2016.
International Search Report and Written Opinion for PCT/US2016/038568, dated Oct. 11, 2016, 13 pages.
International Search Report and Written Opinion for PCT/US2016/064946, dated Mar. 15, 2017, 9 pages.
Matijasevic, G., "Multilayer Circuitry on Metal Substrates," Electronics Cooling Magazine, 9 pages, Sep. 1, 2000.
Orlovskaya et al., "Robust Design and Manufacturing of Ceeramic Laminates with Controlled Thermal Residual Stresses for Enhanced Toughness," Journal of Material Science, vol. 40, Issue 20, pp. 5483-5490, Oct. 2005.
Schwartz, E., "Roll to Roll Processing for Flexible Electronics," Cornell University, pp. 1-24, May 11, 2006.
Wright, S.L. et al., "Characterization of Micro-bump C4 Interconnects for Si-Carrier SOP Applications," Electronic Components and Technology Conference, pp. 633-640, 2006.

\* cited by examiner

LAMINATED INTERPOSERS AND PACKAGES WITH EMBEDDED TRACE INTERCONNECTS

RELATED APPLICATIONS

This continuation application claims the benefit of priority to U.S. patent application Ser. No. 15/187,739 to Gamini, filed Jun. 20, 2016, which in turn claims priority to U.S. Provisional Patent Application No. 62/183,692, filed Jun. 23, 2015, and U.S. Provisional Patent Application No. 62/194,753, filed Jul. 20, 2015, all of these incorporated by reference herein in their entireties.

BACKGROUND

With rapid evolution of the electronic industry, some major obstacles have surfaced. The need for higher performance, thinness, and thermal performance of the electronic package have pushed the industry search for new packaging technologies. Chip technology has remained mostly in the two-dimensional realm, but an explosion in the number of input-output pins needed for higher performance has led to packaging and assembly challenges, and major heat dissipation and reliability problems.

An initial solution to pin proliferation is the package-on-package platform with perimeter contacts—a solution with numerous benefits, but limited long-term viability due to the relatively small number of pin connections possible between packages, as well as cost and thickness penalties. Another solution is die-stacking with wire bond connections—an otherwise good solution that suffers from yield, thermal, and testing issues as well as performance limitations.

Prior to switching to real 3D chip stacking as an ultimate solution, a 2.5D solution has been proposed in the industry as a bridge between technologies. The state of the art of the 2.5D solution can be typified by use of interposers of thinned, low coefficient-of-thermal-expansion (CTE) wafers made of silicon or glass substrate, with metal plated via holes that are drilled or bored to extend through the substrate between the top and bottom surfaces. Optional redistribution layers (RDLs) may be deposited on either or both sides of a given interposer. The metal plated vias, sometimes called "through-silicon-vias" (TSVs), are often implemented with small diameters and high aspect ratios that present a number of fabrication challenges. For example, drilling tends to be time consuming, and an isolation layer and/or seed layers for the plating are often required. Plating is subject to formation of undesirable voids, lowering yield and lowering structural reliability.

SUMMARY

Laminated interposers and packages, with embedded trace interconnects are provided. An example process for making an interposer or package achieves vertical conductive vias in the package by depositing conductive traces on multiple wafers or panes, then laminating these substrates into a stack, thereby embedding the conductive traces. The laminated stack is sliced to dimensions of an interposer or electronic package. A side of the sliced stack is then used as the top of the interposer or package, rendering some of the horizontally laid traces into usage as vertical conductive vias. The interposer or package can be finished or developed by adding redistribution layers on the top and bottom surfaces, and active and passive components. Electronic components can also be embedded in the laminated stack. Some of the stack layers can be active dies, such as memory controllers, memory storage arrays, and processors, to form a memory subsystem or self-contained computing device.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

Figure 1:
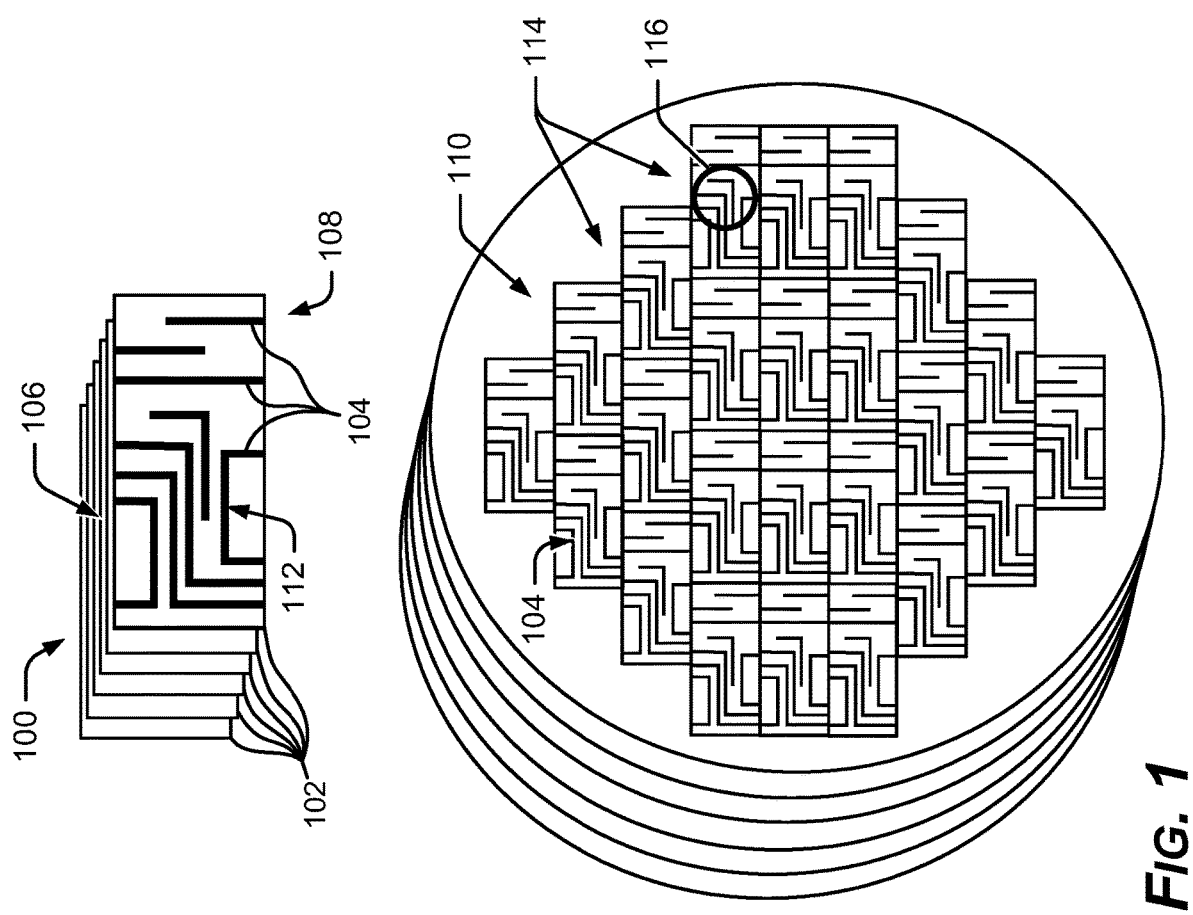
FIG. 1 is a diagram of example conductive traces on each of a stack of wafers for making interposers or packages with embedded conductive vias.
Figure 1:
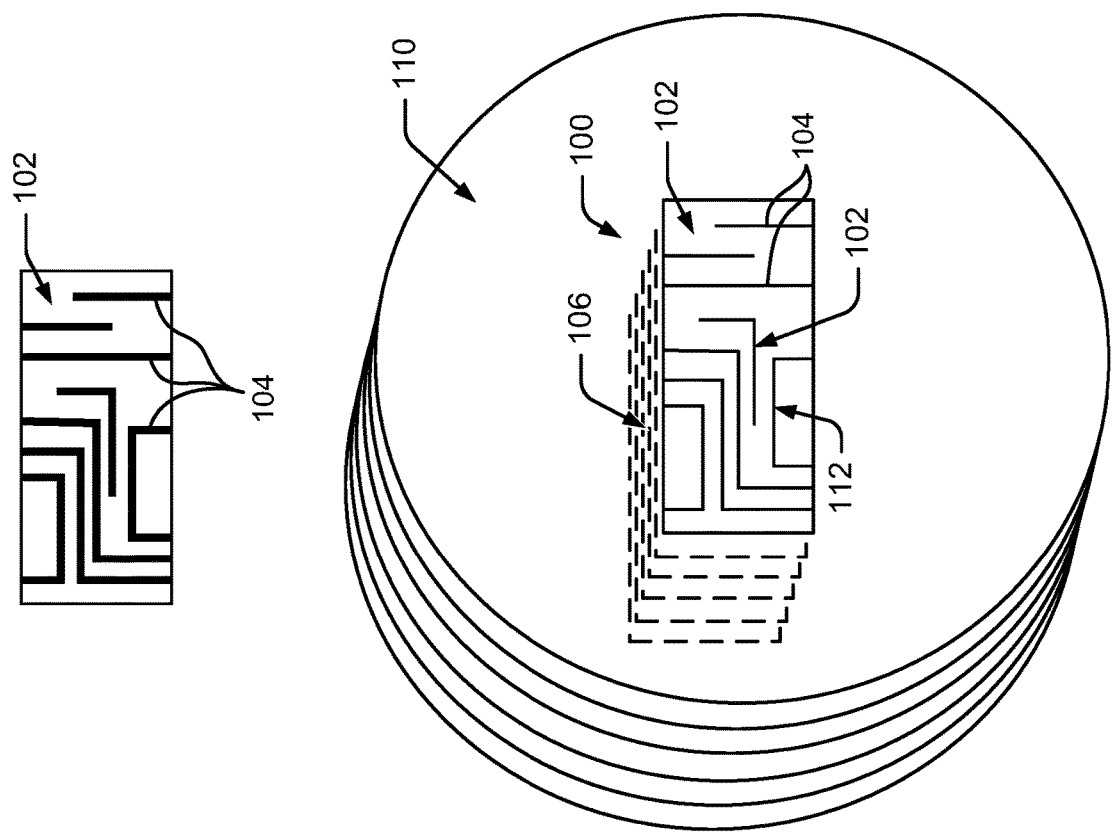

This disclosure describes example laminated interposers and packages with embedded trace-vias and interconnects.

An example process for making an interposer or package achieves vertical conductive vias in the interposer or package by forming or depositing circuit traces (conductive metal lines, or printed circuit) on an outside surface of each of multiple wafers or panes, and then laminating the wafers or panes into a stack, thereby embedding the conductive traces. Laminating can include one or more of adhering, layering, joining, fusing, and so forth. The laminated stack of wafers can then be sliced to the desired dimensions of an interposer or electronic package. A sliced side of the laminated stack becomes the top of an interposer or electronic package, thereby rendering the horizontally laid traces into vertical conductive vias and horizontal interconnects. Slicing cuts through the thickness dimension of each of the stacked wafers, revealing conductive ends of the trace pattern laid on each wafer or pane. The top of the interposer or package reveals an edge-on view of the side edges of the stacked wafers, and the sandwiched traces between the stacked wafers.

The two-dimensional conductive traces laid on a wafer and embedded within the body of the interposer or electronic package during lamination provide vertical through-substrate-vias and conductive horizontal interconnects for the interposer or package. This avoids the conventional difficulties and time-consuming effort of drilling or boring vias (holes) through a substrate, and then layering, seeding, and plating the vias in conventional TSV approaches, in which the plating is also susceptible to voids and gaps.

In various embodiments, interposers and packages having via-less top-to-bottom interconnects, referred to herein as trace-vias, are described below. "Via-less," as used herein, means without a drilled hole. In a number of embodiments, conductive traces are deposited on individual wafers (or panels) which can then be thinned and laminated on top of each other to yield a stacked structure with a desired thickness. The stack is then sliced to form a via-less interposer or package in which the conductive endpoints (or pads) of conductive traces running from top to bottom, for example, are revealed on the top surface and the bottom surface of the sliced stack.

These conductive ends act as the top and bottom termini of the trace-vias which, by virtue of the original trace deposition, can extend continuously through the interposer or package from surface to surface (each surface being formed by a respective slice through the stack). The traces embedded between the substrate layers of the wafers, and sometimes extending from surface to surface, constitute the continuously routed, via-less (hole-less) vertical conductive vias (trace-vias) and horizontal conductive interconnects. The conductive ends of the trace-vias exposed on a sliced surface can be further developed with redistribution layers (RDLs), connections to active and passive components, connection to other interposers or package layers, or can be mounted in a package, can form the core of an assembly.

Example Systems

FIG. 1 shows example construction of a laminated interposer 100 made of panes of a substrate 102 with trace interconnects, such as conductive trace-vias 104, becoming embedded between laminated layers. The example laminated interposer 100 and its dimensions are not shown to relative scale, some thicknesses are exaggerated to illustrate features. In an implementation, the conductive traces 104 are formed, placed, deposited, plated, sputtered, or otherwise applied, onto a surface, such as a flat surface of the substrate 102. The conductive traces 104 may be conductive trace lines, a trace pattern, a metal plane, a printed circuit pattern of conductive lines, a redistribution layer, wires, leads, pads, or other conductors. The example construction achieves vertical conductive trace-vias 104 in the interposer 100 (or package) by depositing the conductive traces 104 on the multiple panes of the substrate 102, and then laminating these panes of the substrate 102 into a stack that is the laminated interposer 100, thereby embedding the conductive traces 104 between layers. The embedded conductive traces 104 are accessed as the vertical conductive trace-vias 104 at a top surface 106 of the interposer 100 and at a bottom surface 108 of the interposer 100, for example. Cross-sectional profiles of the conductive traces 104 can adopt numerous shapes, for example rectangular, square, semicircular, ovaline, round, contoured, triangular, trapezoidal, etc.

The panes of substrate 102 may be sliced from larger wafers 110 of the substrate 102. The laminated stack is sliced to desired dimensions of the interposer 100 or electronic package. This may be accomplished by stacking the wafers 110, and slicing into the depth or stacked thickness of the stacked wafers 110. A sliced side 106 of the stack 100 is now used as the top surface 106 of the interposer 100 or electronic package. Using the sliced side 106 as the top surface 106 renders the conductive traces 104, which were laid horizontally with respect to the flat surface of the wafer 110, as vertical conductive trace-vias 104 with respect to the top surface 106 of the interposer 100. There are horizontal interconnects 112 too, with respect to the top surface 106 of the interposer 100.

By placing repetitive instances 114 of a pattern 116 for the conductive traces 104 across the surface of a single wafer 110 or across the surfaces of multiple wafers 110, the wafers 110 may be stacked and singulated through dicing or other slicing methods, into numerous instances of panes 102 for the interposer 100. A different pattern 116 for the conductive traces 104 may be used for each layer (wafer 110 or pane 102) to be laminated into a stack 100, depending on vias 104 and interconnects 112 desired within the example interposer 100.

The material for the panes of substrate 102 or wafer 110, may be semiconductor, silicon, dielectric, glass, epoxy, polymer, molding material, a liquid crystal polymer (LCP), a low temperature co-fired ceramic (LTCC), a high temperature co-fired ceramic (HTCC), sintered layers of ceramic green sheets, and so forth.

Each pane of substrate 102 or wafer 110 may be thinned, prior to laminating into a stack 100. For example each substrate 102 may be thinned to around 2-500 microns, for example. In an implementation, the width and length of the interposer 100 are both eight times or more larger than the thickness of the interposer 100, and the thickness of the interposer, from the top surface 106 to the bottom surface 108, is less than one millimeter.

Stacked wafers 110 having multiple instances of the conductive traces 104 may be sliced by a water jet, diamond saw, or dicing blade, for example, into singulated individual interposers 100 or other packages. One or more redistribution layers (RDLs) may be added on the top surface 106 and/or the bottom surface 108 of the interposer 100.

Optional through-substrate-vias may be made through a thickness (y-dimension) the wafer 110 or pane 102 to connect one side of a given wafer 110 or pane 102 to the other opposing side, either for connection to another conductive trace 104 of a different wafer 110 or pane 102, or when multiple conductive traces 104 are applied to both sides of a given wafer 110 or pane 102.

Figure 2:
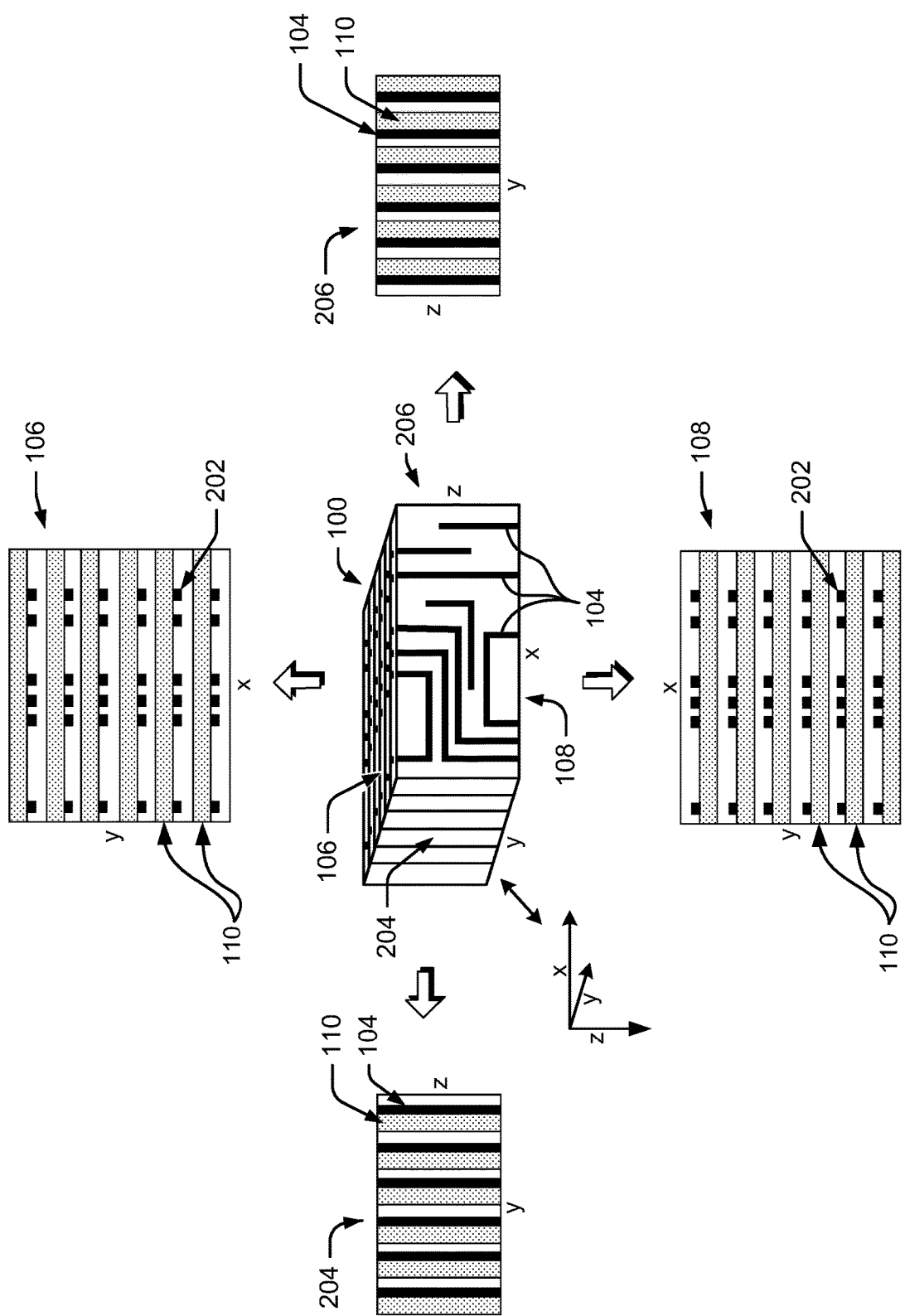
FIG. 2 is a diagram of different views of an example interposer or package.

FIG. 2 shows the example interposer 100 from different views, with axes labeled. In an implementation, the direction of slicing the interposer 100 from a stack of wafers 110, that is, slicing in a "down" direction or "depth" dimension, becomes a width or "y" dimension when the sliced surfaces are "flipped" and adopted as the top surface 106 and bottom surface 108 of the interposer 100. The top surface 106 and bottom surface 108 reveal conductive ends 202 of the conductive traces 104, following the slicing. The conductive ends 202 are the connective "tops" and "bottoms" of the vertical conductive trace-vias 104, previously laid on the wafers 110 as horizontal conductive traces 104. Side views 204 & 206 are also sliced surfaces, when the example interposers 100 are singulated from large wafers 110, and show edge-on views of the stacked wafers 110 and conductive traces 104 of each wafer layer. The side profile of the conductive traces 104 may include vertical conductive via parts 104 and horizontal conductive interconnect parts 112, the combination appearing as a solid line 104 in the side profiles of views 204 & 206.

A given interposer 100 or package has x and y dimensions in the lateral top and bottom surfaces 106 & 108 and has a thickness "t" in the z direction. In an embodiment, each of the "x" and "y" dimensions is at least 8 times larger than thickness "t", although smaller or larger dimensional ratios may be implemented. Also, "t" is generally thinner than 500 microns so that the resulting interposer is very thin and, in an implementation, does not have components assembled by surface mount technology to its thickness side. In alternative embodiments, the interposers 100 may be fabricated with larger thicknesses and/or may have components assembled to the thickness side by surface mount technology or other techniques.

Figure 3:
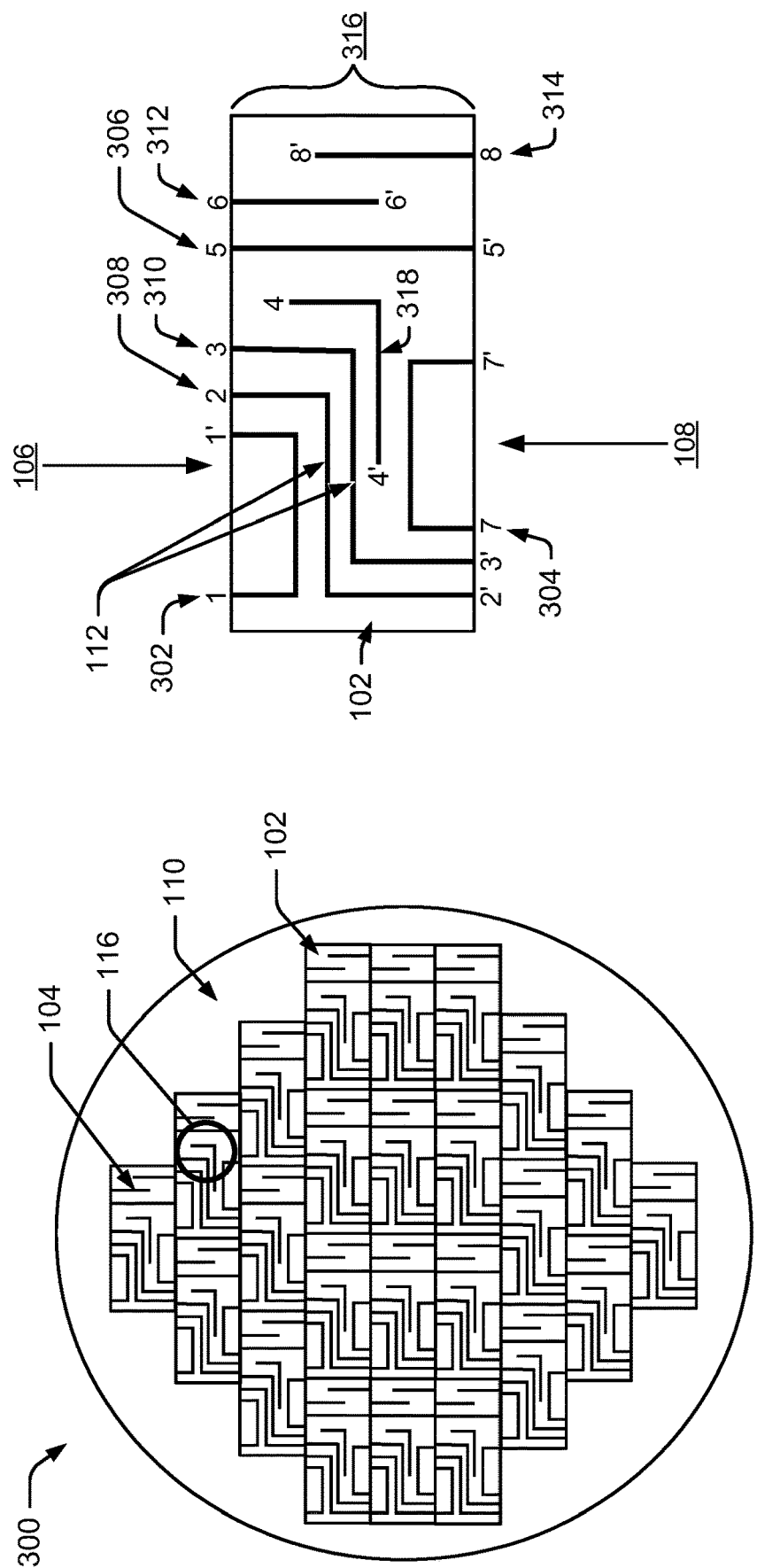
FIG. 3 is a diagram of various interconnect configurations possible in an example interposer or package.

FIG. 3 shows a fabrication stage 300 for the example interposers 100, starting with forming at least one selected pattern 116 for the conductive traces 104 to be applied as redistribution layers (RDLs), for example, on the wafers 110 or panes of substrate 102. The pattern 116 for the conductive traces 104 may establish many different kinds of vias and interconnects for the finished interposer 100 or electronic package. For example, the conductive traces may form a trace-via (1-1') 302 between a first conductive end on the top surface 106 and second conductive end on the same top surface 106; a trace-via (7-7') 304 connecting a bottom surface conductive end to another bottom surface conductive end; a trace-via (5-5') 306 connecting a top surface conductive end to a bottom surface conductive end in a straight pathway; a trace-via (2-2') 308 or trace-via (3-3') 310 connecting a top surface conductive end to a bottom surface conductive end and including a lateral (horizontal) displacement or horizontal interconnect 112; or a trace-via (6-6') 312 or trace-via (8-8') 314 starting at a sliced top surface 106 or bottom surface 108, and terminating within a thickness 316 of the wafer 110 or substrate 102. A trace-via (4-4') 318 may also start and terminate within the thickness 316 of the wafer 110 or substrate 102, without connecting to a conductive end at a surface of the example interposer 100. An adjacent differential pair of two conductive traces 104 in the interposer 100 can also have a pathway that maintains a same impedance along the path from the top surface 106 of the interposer 100 to the bottom surface of the interposer 108.

Figure 4:
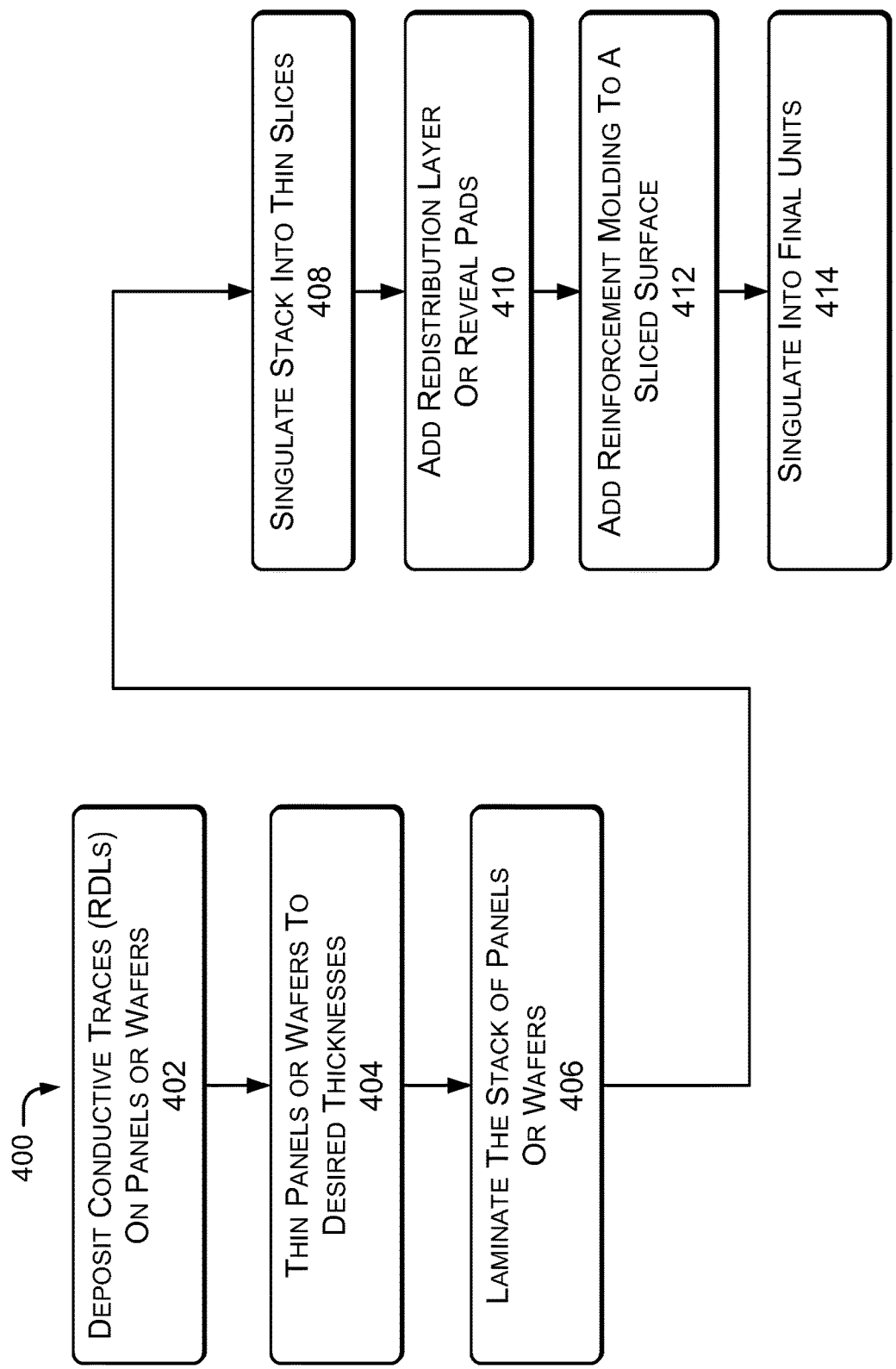
FIG. 4 is a flow diagram of an example process for laminating panels to make an electronic package.

FIG. 4 shows an example process 400 for making an example interposer 100 without needing to make conventional via holes for the conductive trace-vias 104. Operations of the example process 400 are shown as individual blocks.

At block 402, conductive traces 104 are deposited on a panel 102 or wafer 110.

At block 404, the panel 102 or wafer 110 may optionally be thinned to a desired thickness.

At block 406, after alignment, the (thinned) panels 102 or wafers 110 are laminated together to make a stack high enough to serve as the "y" dimension of the interposer 100. In other words, the height (or depth) of the stack of panels 102 or wafers 110 is the same as the width of the top of the interposer 100 being constructed. The laminating can include one or more of adhering, layering, joining, fusing, and so forth.

At block 408, the laminated stack 100 is singulated into thin slices of a thickness that will be the "depth" dimension of the interposer 100 along the "z" dimension, shown in FIG. 2. The singulation process reveals the extremities (endpoints) of the conductive trace-vias 104. The conductive ends 202 of the metal traces 104 can be below, flush with, or above the slice surfaces 106 & 108.

At block 410, in an implementation, one or more functional layers may be added to the example interposer 100 or electronic package. For example, one or more redistribution layers (RDLs) can be deposited or formed on the sliced surfaces, such as top surface 106 and bottom surface 108. In another implementation, the slicing process reveals the conductive endpoints 202 or pads, and the endpoints or pads are used to directly connect with components and other circuits.

At block 412, the example interposer 100 or package may be reinforced with molding or other processes, for example on the sliced surfaces. The molding may provide mechanical reinforcement, but may also provide an insulation or layer of dielectric, for example.

At block 414, a batch of interposers 100 or packages, consisting of a stack of wafers 110, for example, can be singulated into final individual units. The steps of this example process 400 do not have to be in the order above. Rather, it is possible that other operations may be included before the final singulation, such as applying joining material (e.g., solder), placing passive devices, active chip placement, and so forth.

Figure 5:
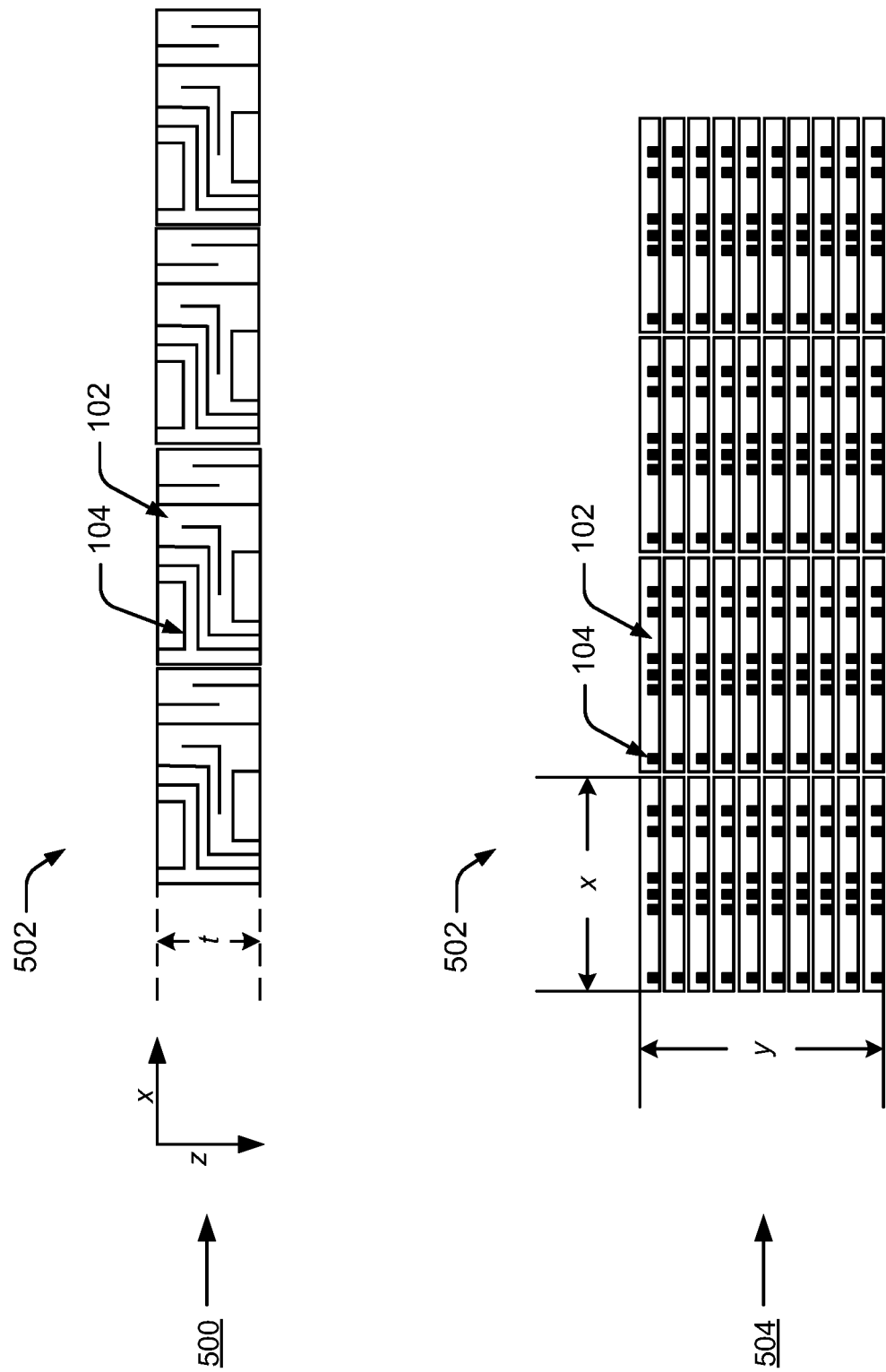
FIG. 5 is a diagram of a strip of panes of substrate and conductive traces for making a laminate stack of an interposer or package.

FIG. 5 shows a side view 500 of an example slice 502 of a stack of panes 102 or wafers 110 that exposes the conductive trace-vias 104 along the x-z plane. A top view 504 of the example slice 502 shows the x-y plane of the top surface 106 where the conductive trace-vias 104 terminate as conductive ends 202 and thereby "exit" the example interposer 100. In an implementation, these views 500 & 504 show a state of construction just after a slicing process and before adding optional redistribution layers on the sliced top surface 106 or bottom surface 108, as in FIG. 2.

Figure 6:
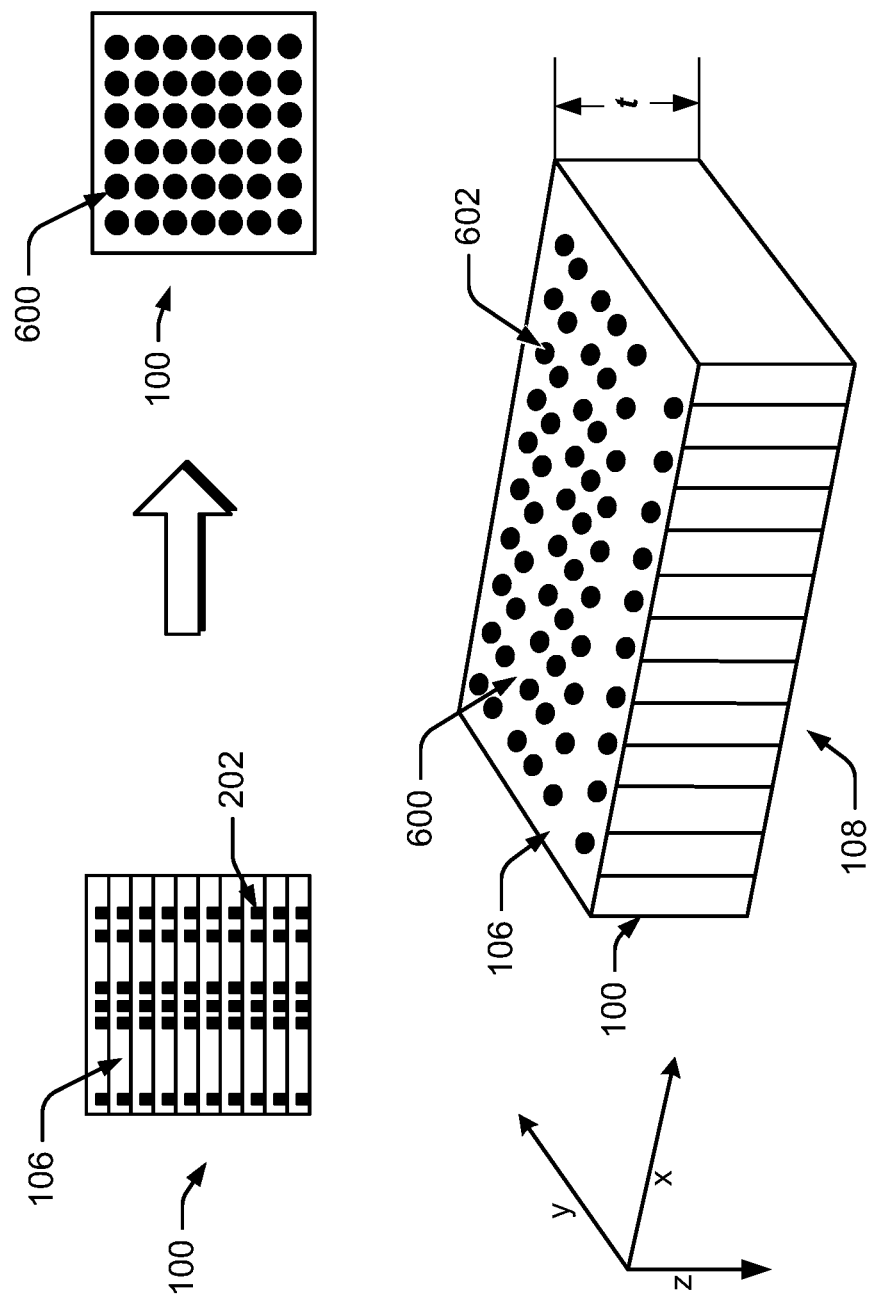
FIG. 6 is a diagram of a redistribution layer added to conductive ends of an example laminate interposer.

FIG. 6 shows optional deposition of one or more redistribution layers 600 on a top surface 106 or a bottom surface 108 of the interposer 100 or package. An example redistribution layer 600 makes the conductive ends 202 of the conductive traces 104 accessible for further connection through larger contact pads, bonding pads, bump balls 602, and so forth.

Figure 7:
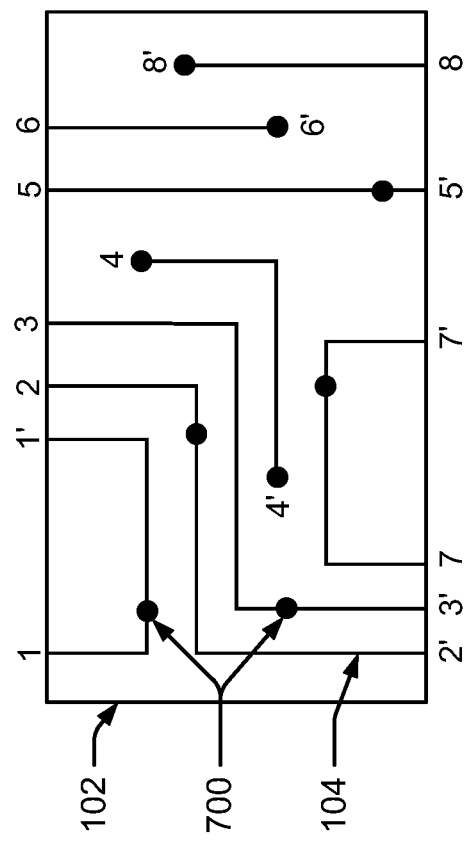
FIG. 7 is a diagram of conductive vias through a thickness of a substrate panel for connecting conductive traces on each side of the panel.
Figure 7:
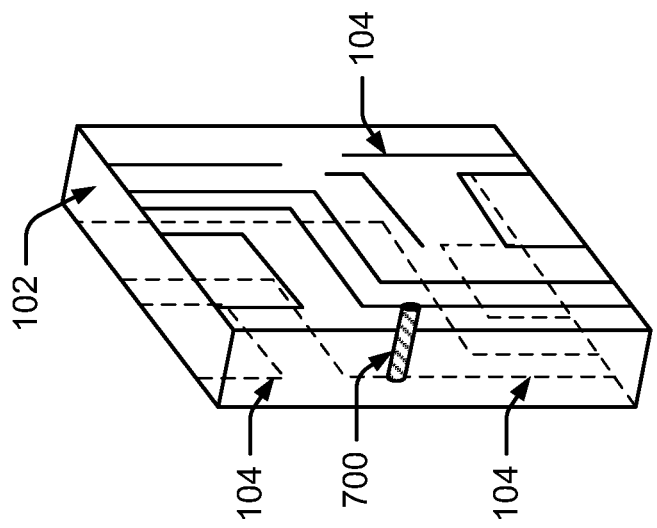

FIG. 7 shows example connections between two sides of a substrate layer 102 using through-thickness vias 700 to connect conductive traces 104 that have been placed on both sides of a given substrate 102, panel, or wafer 110. In the case of substrate materials, such as silicon, glass, and other types of substrates 102 these vias 700 can be conventional through-silicon-vias (TSVs) or generally, through-substrate-vias.

The ability to transverse the thickness of the substrate 102 or wafer 110 with a through-substrate-via 700 provides conductive coupling between the laminations of the stack 100 composing the interposer or package. In some cases, the conductive traces 104 of the various laminate layers of the stack 100 can be conductively coupled "outside" the interposer 100 by connecting the relevant conductive ends 202 of the layers to be connected on the sliced top surface 106 or the sliced bottom surface 108. However, it can be advantageous to connect the conductive traces 104 of different laminate layers within the interposer 100 because they are so close together, the thickness of a substrate 102 being mere microns in some implementations. Also, there are some traces, such as trace 312, trace 314, and trace 318 that have at least one conductive end 202 that is not accessible at a surface, and so intrabody circuitry within the interposer 100 or package can be accomplished more fully with interlaminate through-substrate-vias.

When conductive traces 104 are deposited on both sides of a substrate 102 or wafer 110, then the wafers 110, for example, may be laminated together by intervening a layer of insulating material or a dielectric between wafers 110, either as discrete layers or as the adhesive, for example.

Figure 8:
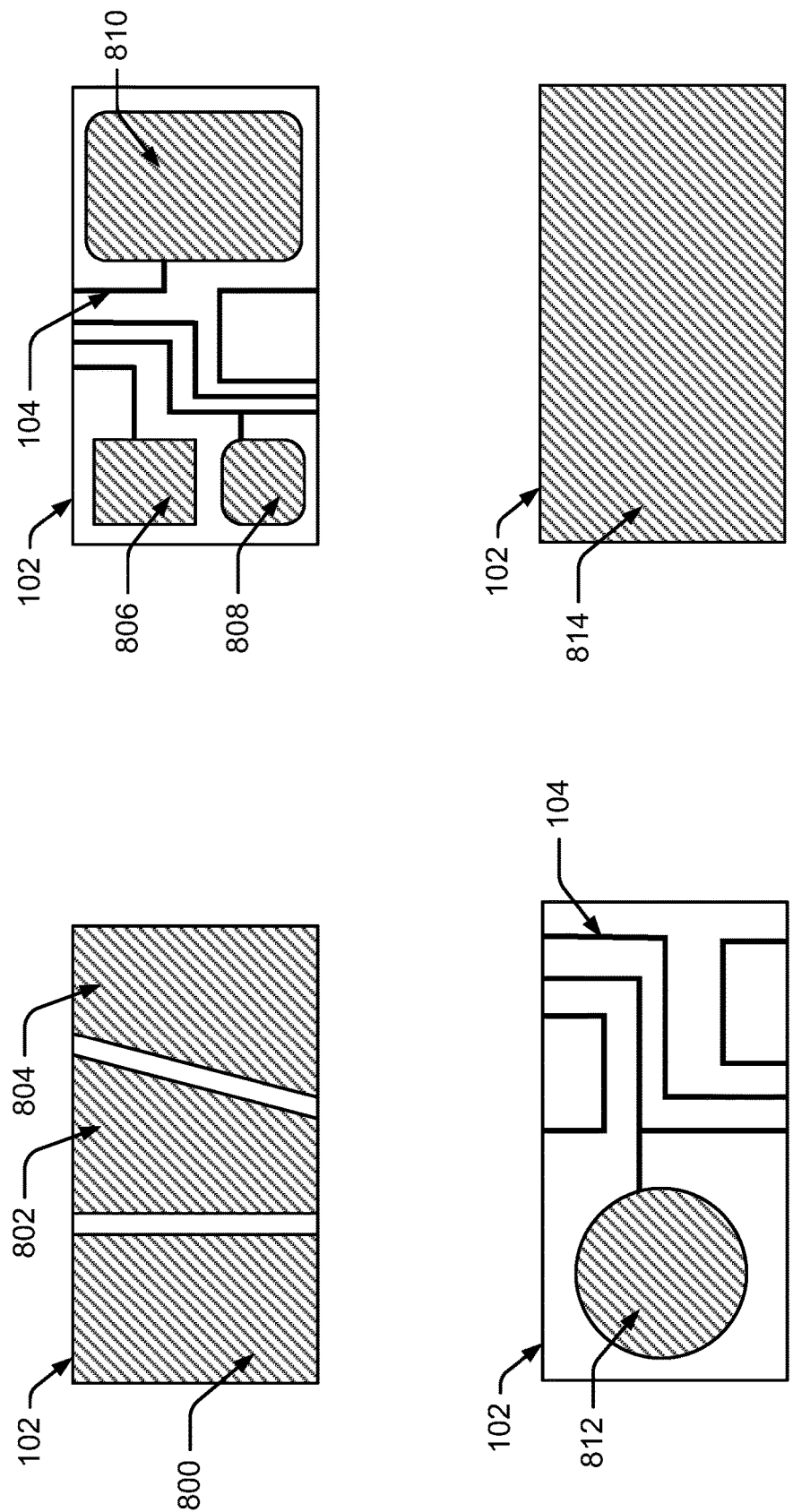
FIG. 8 is a diagram of metal planes on panes of substrate.

FIG. 8 shows an example implementation in which the conductive traces 104 on at least one of the panes of substrate 102 or wafer 110 include or comprise a conductive plate, conductive pad, or conductive plane, such as a metal plane 800, layer, film, or sheet. As shown in FIG. 8, the metal plane 100 may be partial 800 & 802 & 804, covering only part of a pane 102, or may have multiple different configurations and functions 806 & 808 & 810 on the same pane 102, may provide a desired configuration 812 on the pane 102 while sharing the pane 102 with other conductive traces, or may be a full sheet metal plane 814, occupying an entire surface area of a pane 102.

A full metal plane 814 or a partial metal plane 800 & 802 & 804, may provide an electrical power plane or an electrical ground plane, even on a shared pane 102. The metal plane 814 may also provide all or part of a radio frequency (RF) shield, or all or part of a Faraday cage, heat sink, or heat spreader.

In an implementation, the metal planes 800 can be divided into multiple small plane sections 800 & 802 & 804 of power and ground. These metal planes 800 do not exclude having trace-vias 104 in between. The metal planes 800 can also be connected by through-substrate-vias 700 across the substrate layers. Ground or power planes 800 & 802 & 804 can be assembled in a multilayer fashion. Multiple full metal planes 814 or partial metal planes, such as multiple instances of metal plane 812, for example, can be placed between multiple laminate layers to form an onboard plane capacitor within the body of the interposer 100 or package.

Figure 9:
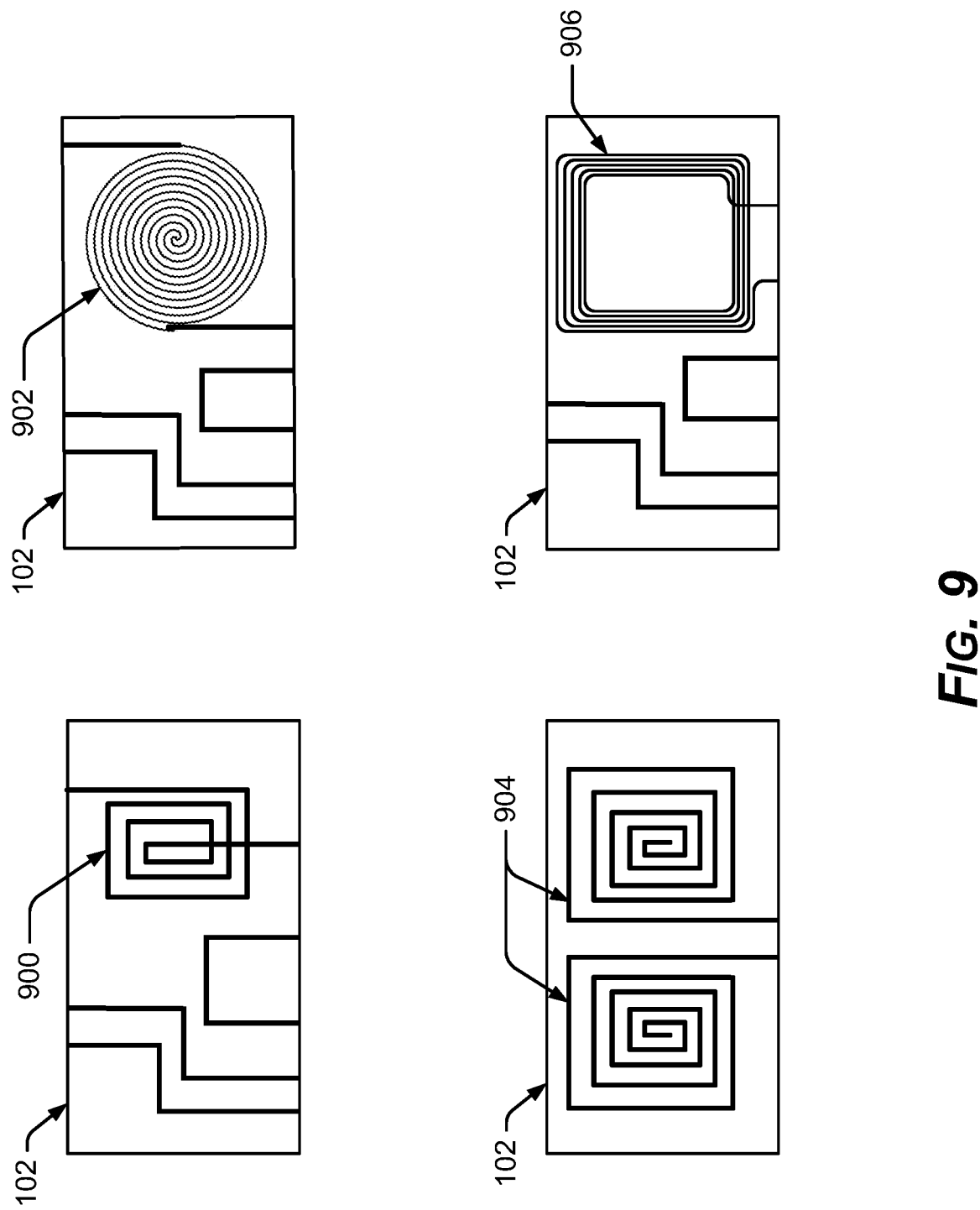
FIG. 9 is a diagram of electronic components formed by conductive traces for the laminated stack of an example interposer or package.

FIG. 9 shows further examples of an example interposer 100 or package, in which the conductive trace 104 provides intrabody hardware between laminations of the example interposer 100 or package. For example, the conductive trace 104 may provide an inductor or coil 900, an electromagnetic or flat RF coil 902, a sensor, an RFID tag, an antenna 904 for UHF, VHF, or Wi-Fi, or a charge-receiving inductance coil 906. The embedded conductive trace 104 may be formed to provide other electronic components.

Figure 10:
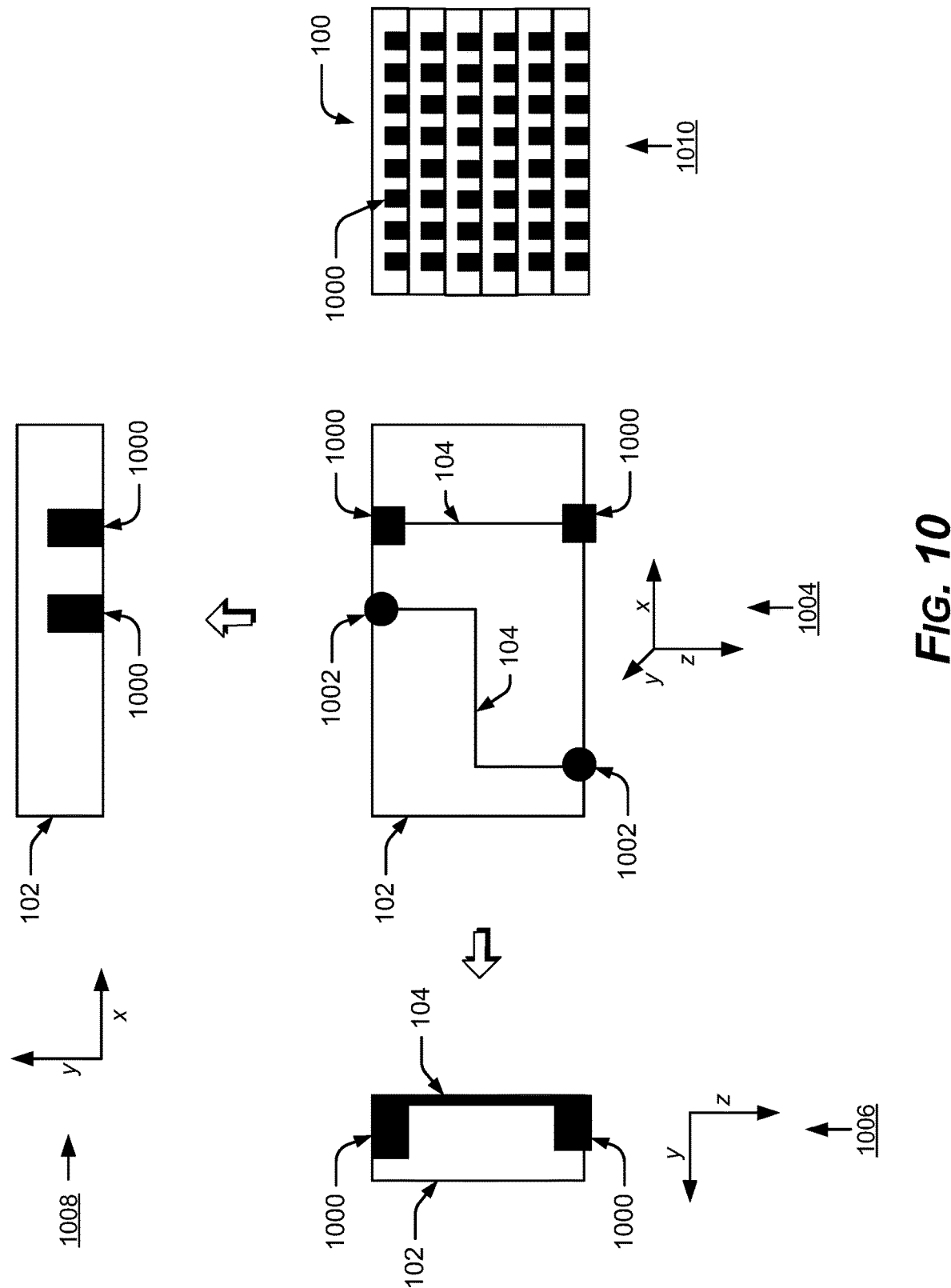
FIG. 10 is a diagram of example bond pads embedded and revealed in a stack laminating process.

FIG. 10 shows implementations of an example interposer 100 or package, in which conductive contacts, such as bond pads 1000 are embedded in or between one or more substrate layers 102. The embedded pads 1000 can be revealed during a slicing process step. The embedded pads 1000 can be larger or smaller than the cross-section of a connected conductive trace 104, but generally an embedded pad 1000 that is wider than its conductive trace 104 is beneficial.

In one embodiment, a pad is formed by a through-substrate-via 1002 in the y-z plane, through a thickness of the pane of substrate 102, and located such that the embedded pad 1000 exposed from the through-substrate-via 1002 is revealed during the slicing process. In FIG. 10, view 1004 shows the example deposited conductive traces 104 and embedded pads 1000 as if facing the "front" flat surface of a pane of substrate 102 or a wafer 110 in the x-z plane. View 1006 shows the example conductive traces 104 deposited in the pane of substrate 102 or wafer 110 from a side view in the y-z, plane. View 1008 shows the example conductive traces 104 deposited in the pane of substrate 102 or wafer 110 from a top view in the x-y plane. In a laminated interposer 100 or package, view 1010 shows multiple rows of the embedded pads 1000, ready for connection to active devices, to passive devices, to additional interposers 100 or packages, or, ready for assembly or placement of one or more redistribution layers.

Figure 11:
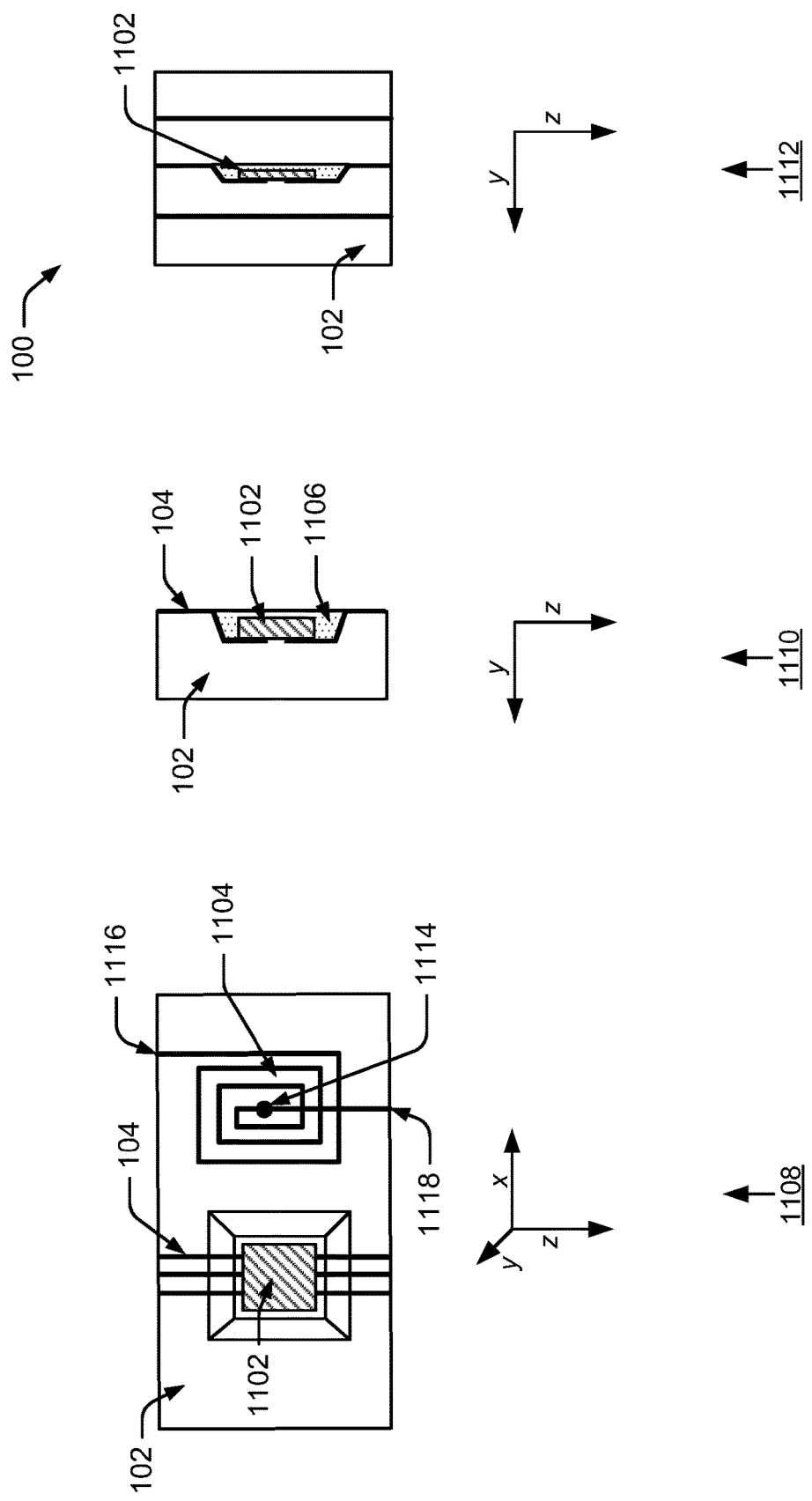
FIG. 11 is a diagram of active components embedded in a pane of substrate for an example laminated interposer or package.

FIG. 11 shows implementations of an example interposer 100 or package, in which active chips or passive electronic devices are embedded within or between laminate substrate layers 102 during the stacking process. The surface of the substrate 102 or wafer 110 may be recessed, for example, to accommodate respective electronic components 1102 & 1104, such as dies, chips, or passive components. The recesses may be filled-in with an insulating material 1106 or a dielectric, or the recesses may be filled in with a laminating material or laminating layer during the stacking and laminating processes. The recesses may also be left as air or gas spaces, some gases and air having inherent insulating and dielectric properties, for example.

In FIG. 11, view 1108 shows the example embedded electronic components 1102 & 1104 and conductive traces 104 as if facing the "front" flat surface of a pane of substrate 102 or a wafer 110 in the x-z plane. View 1110 shows the example embedded electronic components 1102 & 1104 and conductive traces 104 recessed in the pane of substrate 102 or wafer 110 from a side view in the y-z, plane. Likewise, view 1112 shows the example embedded electronic components 1102 & 1104 and conductive traces 104 recessed in the pane of substrate 102 or wafer 110 from a side view in the y-z plane within the laminated stack of an example interposer 100 or laminated package.

In an implementation, an electronic component 1102 & 1104, such as a die, chip, or passive device can be mounted on the conductive traces 104 and embedded between two substrate layers by a laminating layer, without recessing the devices into the surface of the substrate 102 or wafer 110.

FIG. 11 also shows example connection options for an embedded component 1102. For example through-substrate-via 1114 can connect to an upper layer redistribution layer, where conductive end 1116, and a conductive end of through-silicon-via 1114, are on the same side of the pane of substrate 102, or where conductive end 1118, and a conductive end of through-silicon-via 1114, are on the same side of the pane of substrate 102.

Alternatively, through-silicon-via 1114 can connect to a backside of the substrate 102, where conductive end 1116, and a conductive end of through-silicon-via 1114, are on opposite sides of the pane of substrate 102, or where conductive end 1118, and a conductive end of through-silicon-via 1114, are on opposite sides of the pane of substrate 102.

Figure 12:
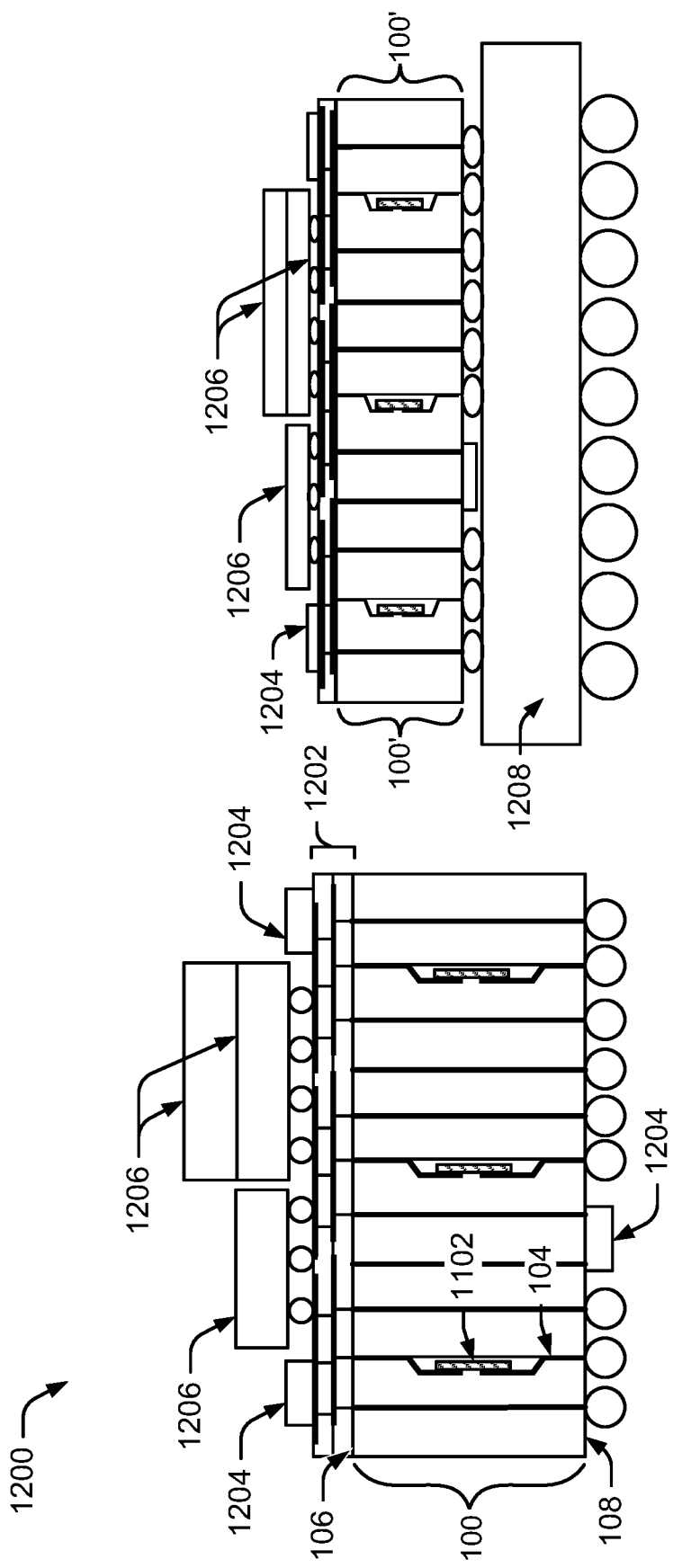
FIG. 12 is a diagram of an example laminated package composed of a stack of substrates with conductive traces, embedded components, and surface-mounted components.

FIG. 12 shows an example electronic assembly 1200 with the example interposer 100 conductively connected to embedded active components 1102 (and optionally connected to embedded passive components too). The example electronic assembly 1200 is also connected through redistribution layers 1202 and surface mount technology (SMT) to passive components 1204 and surface-mounted active components 1206.

The surface-mounted passive components 1204 and active components 1206, such as dies and chips, can be mounted on either of the lateral sliced sides (along x-y plane) composing the top surface 106 or bottom surface 108 of the example interposer 100 or package.

An example interposer 100' may in turn be assembled to a package substrate 1208 or mounted directly to a board. The conductive interconnections between surface-mounted active and passive components 1206 & 1204 and the package substrate 1208, go through the conductive traces 104 in the interposer 100. When the package substrate 1208 is also an interposer, the example interconnections go through both interposers 100' & 1208.

Figure 13:
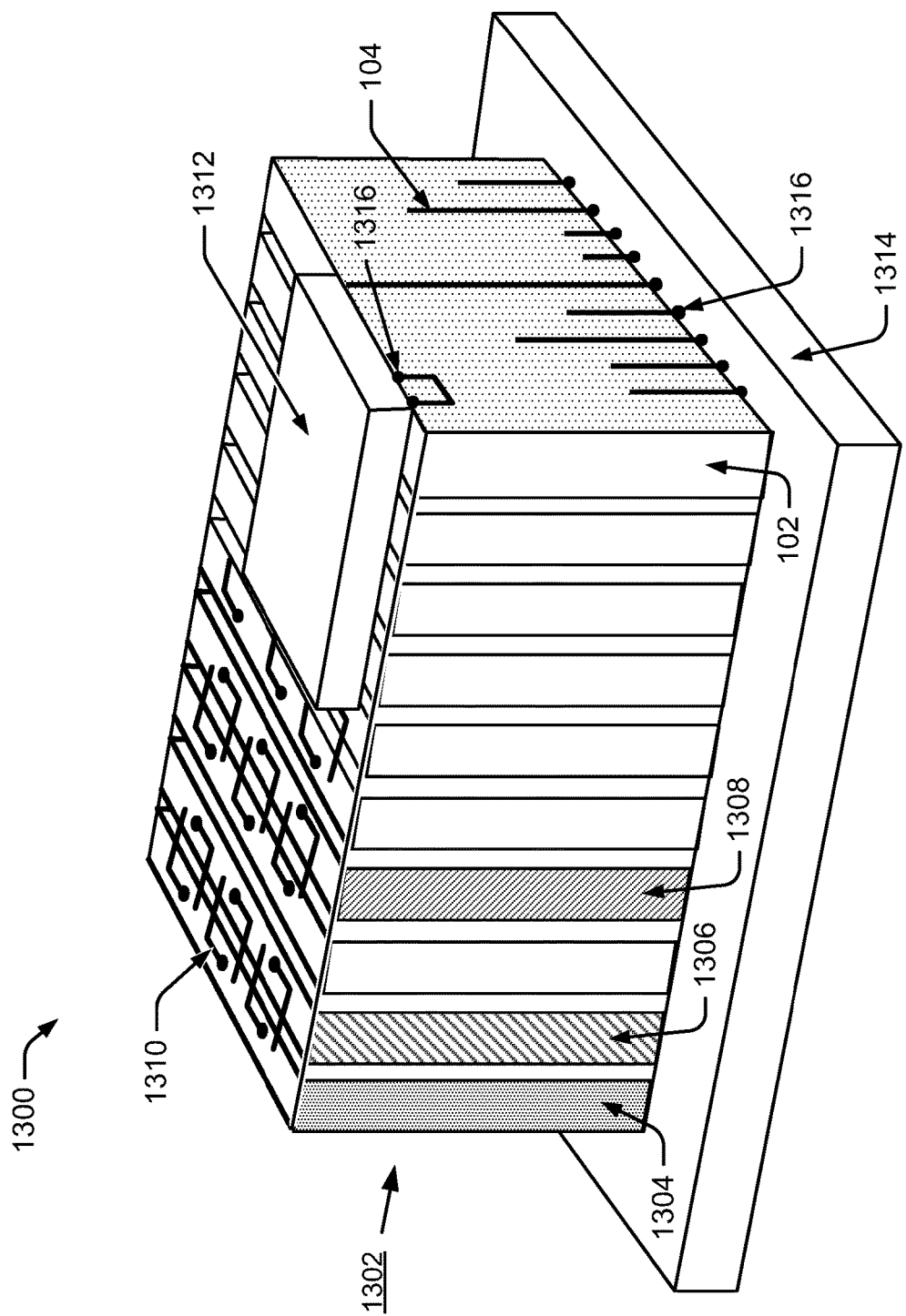
FIG. 13 is a diagram of an example laminated package, with layers of memory controller, memory cells, and/or processors to make a memory subsystem or a self-contained computing device.

FIG. 13 shows an example package 1300 in which the laminated stack 1302 of layers includes an integrated circuit die or dies 1304 & 1306 as one or more of the layers. One or more layers of the stack may be implemented as an IC die (chip) 1304 & 1306 & 1308 instead of being a passive substrate 102 with conductive traces 104 or chip(s) mounted to the passive substrate 102. The individual chips 1304 & 1306 & 1308 employed as laminate layers may be, for example and without limitation, memory chips, such as DRAM, SRAM, flash memory, and so forth, and/or logic chips. In an implementation, a memory controller, for example a DRAM controller or flash controller, may be implemented by one or more chip layers 1304 in the stack, while memory devices having mass storage arrays formed by DRAM, SRAM, or flash memory cells, are implemented by other chip layers 1306 in the stack, so that the overall stack implements an example memory subsystem.

One or more processors 1308 may also be implemented by chip layer(s) 1308 in the stack 1302, so that the processor(s) 1308 and memory subsystem 1304 & 1306 constitute a complete or self-contained computing device, implemented within the stack 1302.

A redistribution layer (RDL) 1310 may be disposed on the top or bottom of the stack 1302 as shown, thus permitting an active semiconductor chip 1312, passive device, or heat spreader to be mounted to the stack bottom and/or top.

Alternatively, an interposer 1314 may be mounted to the top and/or bottom of the stack 1302. Also, bumps 1316 or pads on the top and/or bottom of the stack 1302 permit the stack 1302 to be connected to the other interposer 1314, other substrate, and/or active chip, passive device, or heat spreader.

Figure 14:
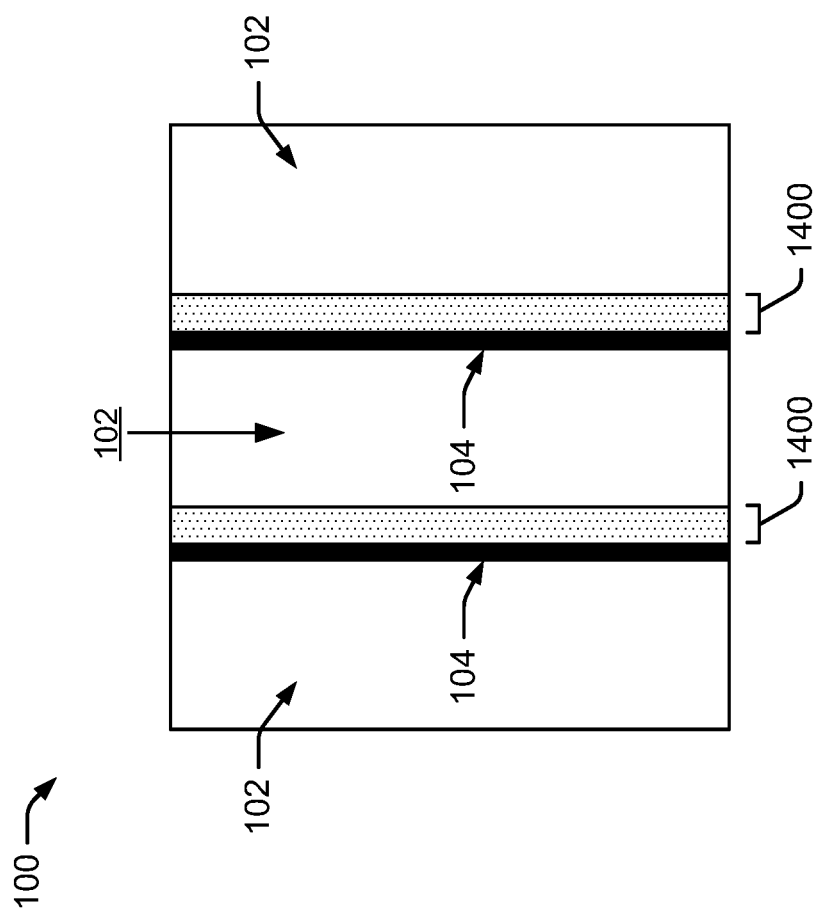
FIG. 14 is a diagram showing placement of example laminating agents.

FIG. 14 shows example laminating agents 1400, joining agents, or adhesives for adhering or joining the panes of substrate 102 or wafers 110 into the laminated stack of an interposer 100 or package 1300 during a laminating process. The joining may be achieved using organic or nonorganic adhesives, for example. Glass frits joining, silicon dioxide joining, glass solder joining, polymer adhesive joining, and metal-to-metal or metal-to-metal with solder/fusion joining are a few of the techniques and processes that can be employed for laminating the panes 102 into a laminated stack 100. A low coefficient-of-thermal-expansion material, or a low coefficient-of-thermal-expansion adhesive, may also be used.

Figure 15:
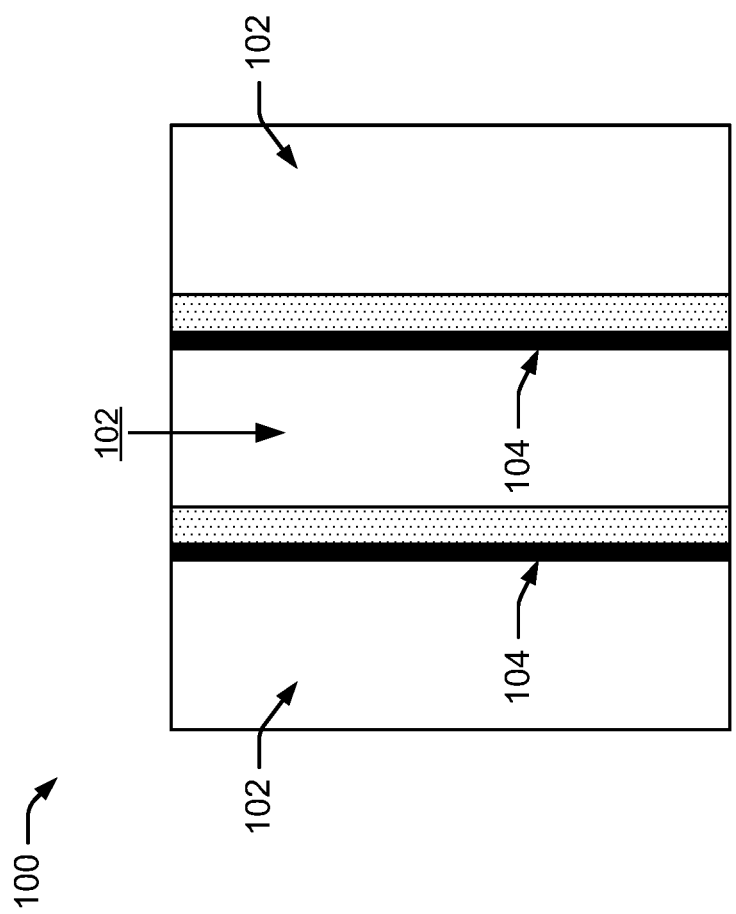
FIG. 15 is a diagram showing placement of example substrate materials.

FIG. 15 shows example materials composing the panes of substrate 102, which are then laminated together into the example interposer 100 or package 1300. Semiconductor materials such as silicon may be used. A layer, pane, or substrate 102 may also be composed of an active chip or die, as in FIG. 13. A layer, pane, or substrate 102 may also be composed of a glass, an insulator, a dielectric, a molding material, a printed circuit board (PCB), a FR-4 glass epoxy, a ceramic, such as sintered layers of ceramic green sheets, a low coefficient-of-thermal-expansion (CTE) liquid crystal polymer (LCP), a low-temperature co-fired ceramic (LTCC), or a high temperature co-fired ceramic (HTCC), for example.

Figure 16:
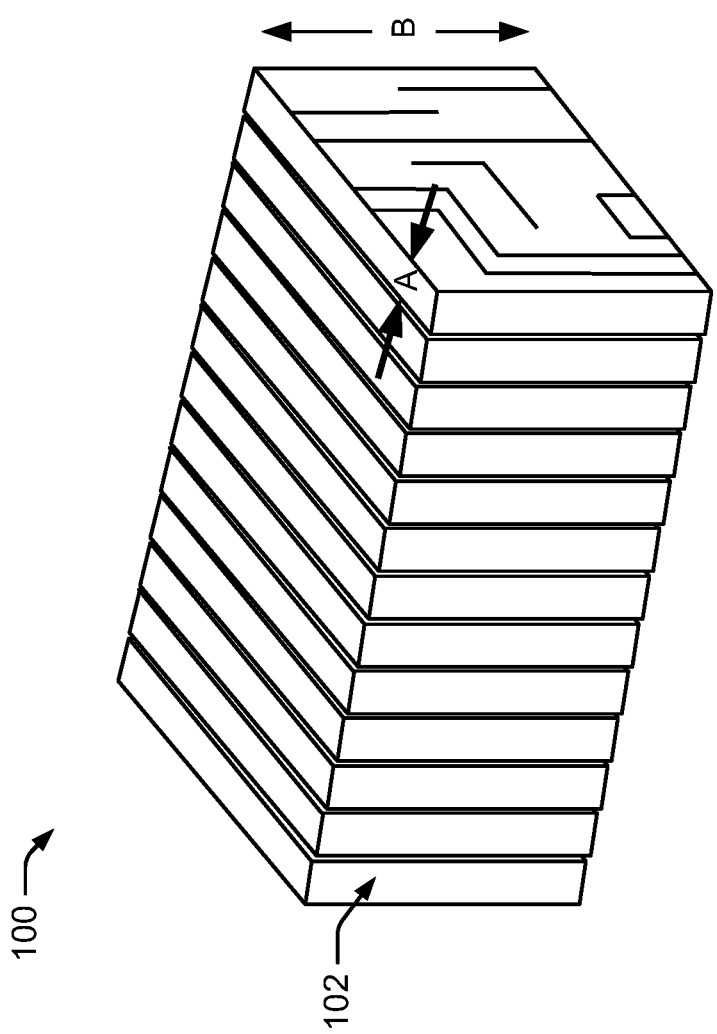
FIG. 16 is a diagram showing example aspect ratios of layer thicknesses to package height in a laminated package.

FIG. 16 shows an example aspect ratio of the example interposer 100 or package 1300, in which layer thickness (A) may be substantially smaller than the stack height (B). In an implementation, the stack height (B) is at least twice the layer thickness (A), although larger or smaller multiples of stack height (B) to layer thickness (A) (that is, the ratio B:A) may be implemented.

Figure 17:
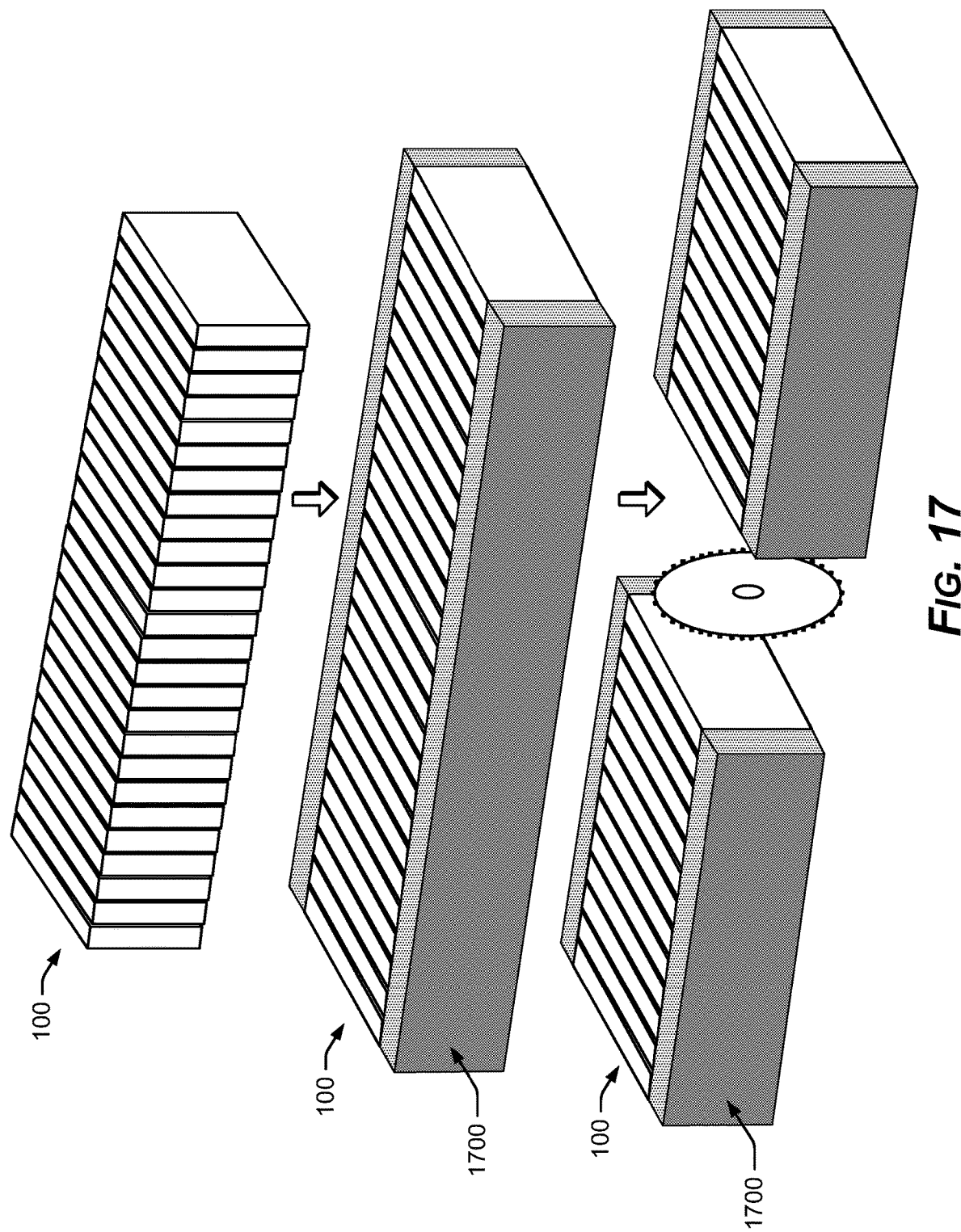
FIG. 17 is a diagram showing example molding applied to sides of a laminated stack for reinforcement.

FIG. 17 shows example molding 1700, reinforcing two sides along the y-z plane surfaces of the example interposer 100 or package for mechanical reinforcement. Techniques other than molding are also possible for achieving the desired mechanical reinforcement, such as banding, coating, immersing, capping, enclosing, and so forth.

Figure 18:
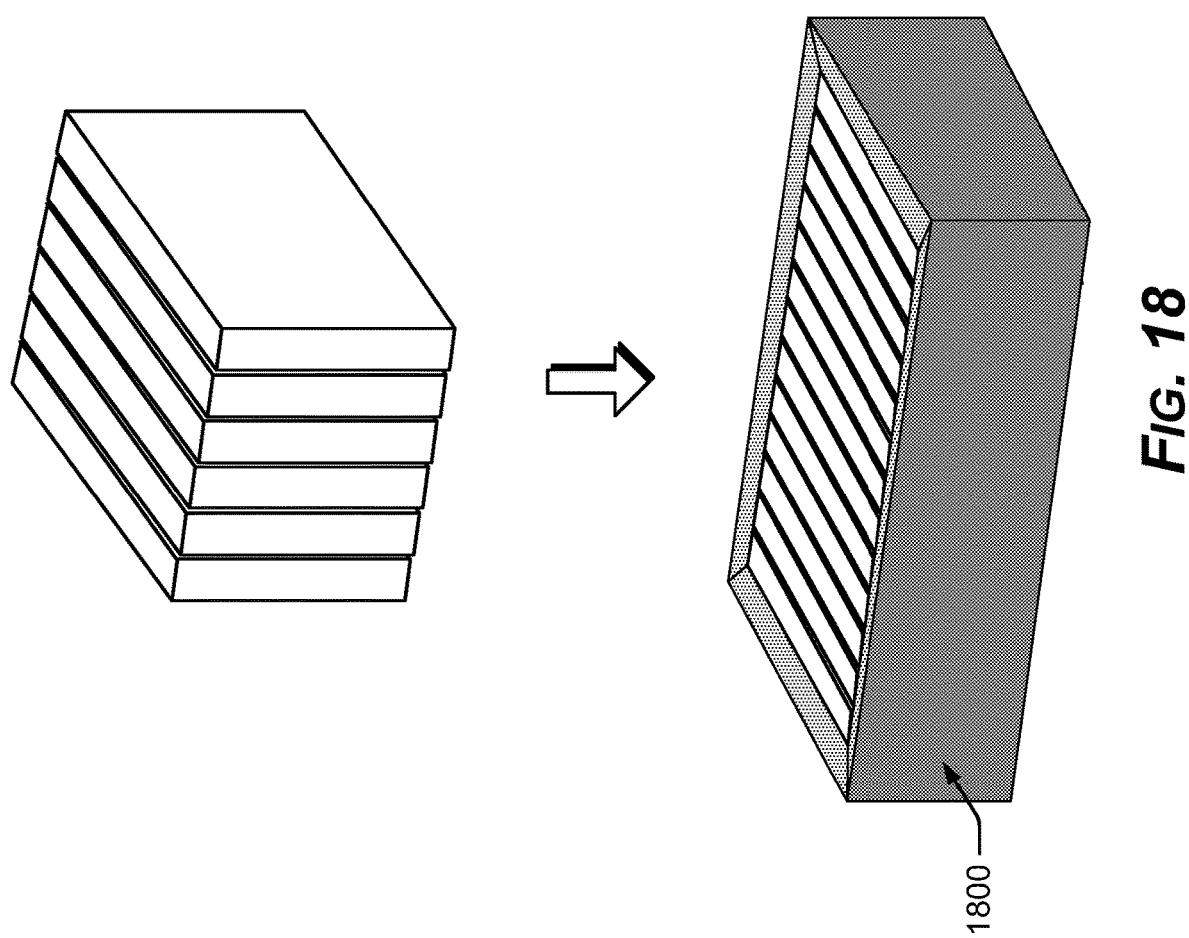
FIG. 18 is a diagram showing example molding applied to four sides of a laminated stack for reinforcement.

FIG. 18 shows example molding 1800 around four sides of the example interposer 100 or package along x-z and y-z plane surfaces of the stack for mechanical support and reinforcement.

Figure 19:
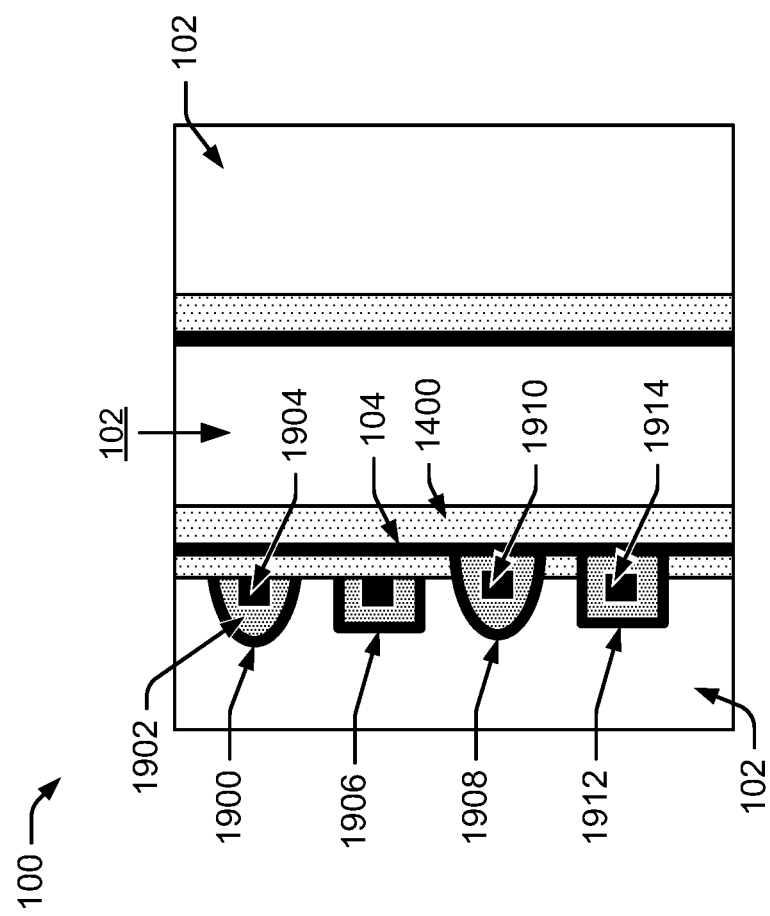
FIG. 19 is a diagram of example coaxial conductive traces.

FIG. 19 shows example conductive traces 1900 in coaxial trace configurations. A first coaxial trace configuration has a first conductive trace 1900 deposited, for example, in a trough of the substrate 102. A dielectric or insulator 1902 is applied (formed, layered, or deposited) over the first conductive trace 1900. A second coaxial conductive trace 1904 is then placed or formed in or on the insulator 1902, so that the first coaxial conductive trace 1900 and the second coaxial conductive trace 1904 are electrically insulated from each other by the dielectric or insulator 1902.

In some implementations, the laminating agent 1400 is insulative, and is applied in such a manner that the first coaxial conductive trace 1900 and the second coaxial conductive trace 1904 are each separate conductors from a main or surface conductive trace 104 laid out on the individual pane of substrate 102.

In an implementation, first coaxial conductors 1908 & 1912 are electrically connected to a third conductive trace 104 in or on the pane of substrate 102. Inner coaxial conductive traces 1910 & 1914 may be surrounded or enclosed by the dielectric or insulation 1902, and also surrounded by the first conductive traces 1908 & 1912. The first conductive traces 1908 & 1912 and the conductive trace 104 may contain interference generated by inner coaxial conductive traces 1910 & 1914, or may shield the inner coaxial conductive traces 1910 & 1914 from outside interference, especially when the conductive trace 104 and the first conductive traces 1908 & 1912 are all connected to a common electrical ground.

A cross-section of the coaxial conductive traces 1900 & 1908 shows that some coaxial conductive traces 1900 & 1908 may be mounded or placed in a rounded trough on the pane of substrate 102, while other coaxial conductive traces 1906 & 1912 may have a square or rectangular cross-section in or on the pane of substrate 102. The cross-section of the coaxial conductive traces can have numerous cross-sectional profiles, such as rectangular, square, semicircular, oval, round, contoured, triangular, and trapezoidal, for example.

Figure 20:
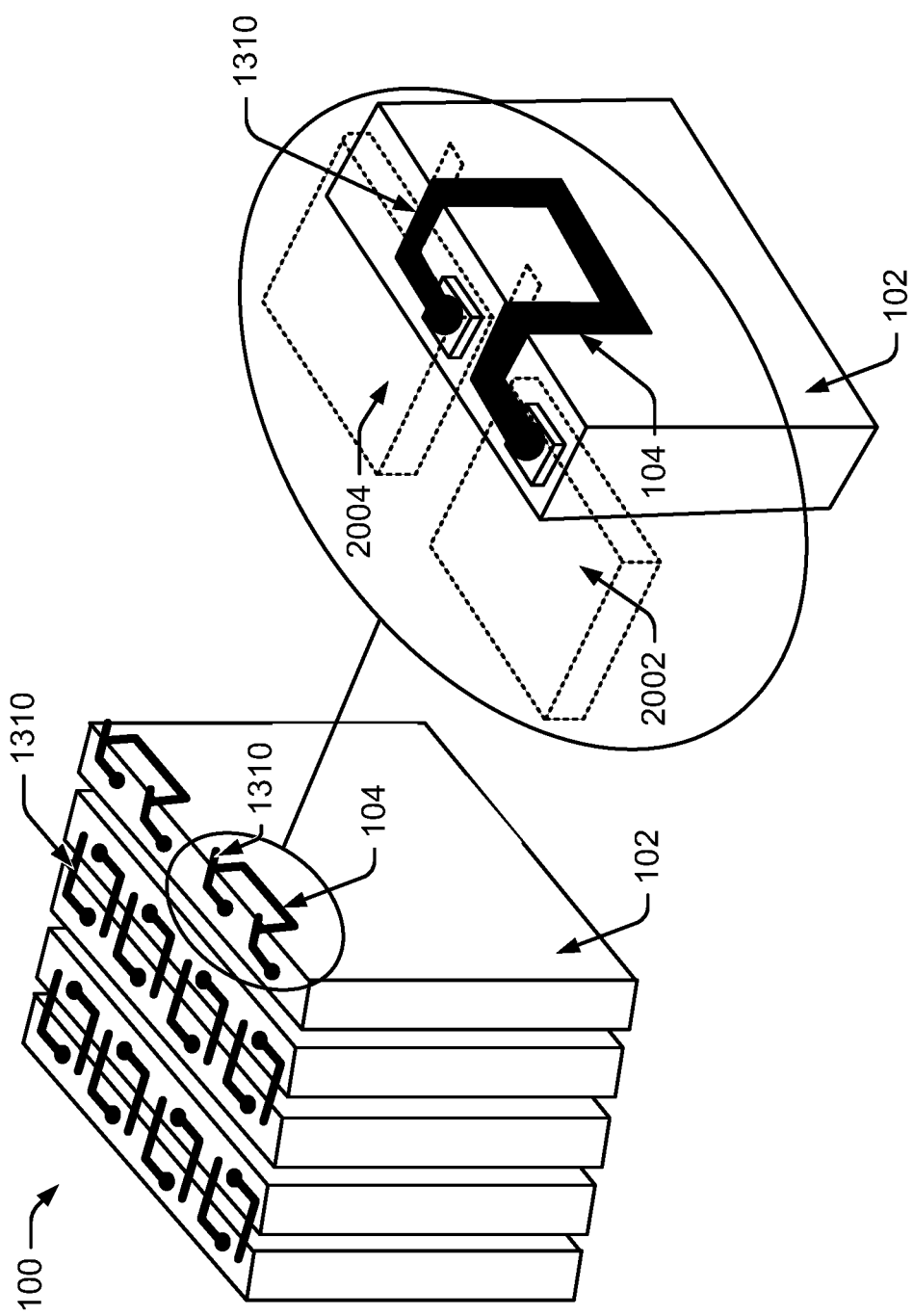
FIG. 20 is a diagram of chips coupled using a wide conductive trace to increase electrical performance and facilitate manufacture.

FIG. 20 shows an example interposer 100 or package in which two or more interposer-mounted chips 2002 & 2004 are electrically coupled together through a conductive trace 104 that is on one or more of the panes of substrate 102. Conductors of a redistribution layer 1310 may intervene between the conductive trace 104 of the interposer 100 and the active surface-mounted chips 2002 & 2004, forming "T" junctions with the conductive traces 104 across adjacent vertical layers 102 of the interposer 100. Conventional trace width and lead spacing, such as 50 micron or 30 micron lines/spaces or vias with $\frac{1}{5}$ or smaller lines/spacing, make conventional electrical performance and manufacturability of such mounted chips 2002 & 2004 a challenge. Because the conductive trace 104 of the example interposer 100 has significantly more relaxed width and spacing requirements compared to existing conventional solutions, the example conductive traces 104 of the interposer 100 can provide wider traces 104 with higher electrical capacity than conventional, thereby increasing performance and making such a package easier to manufacture.

Example Methods

Figure 21:
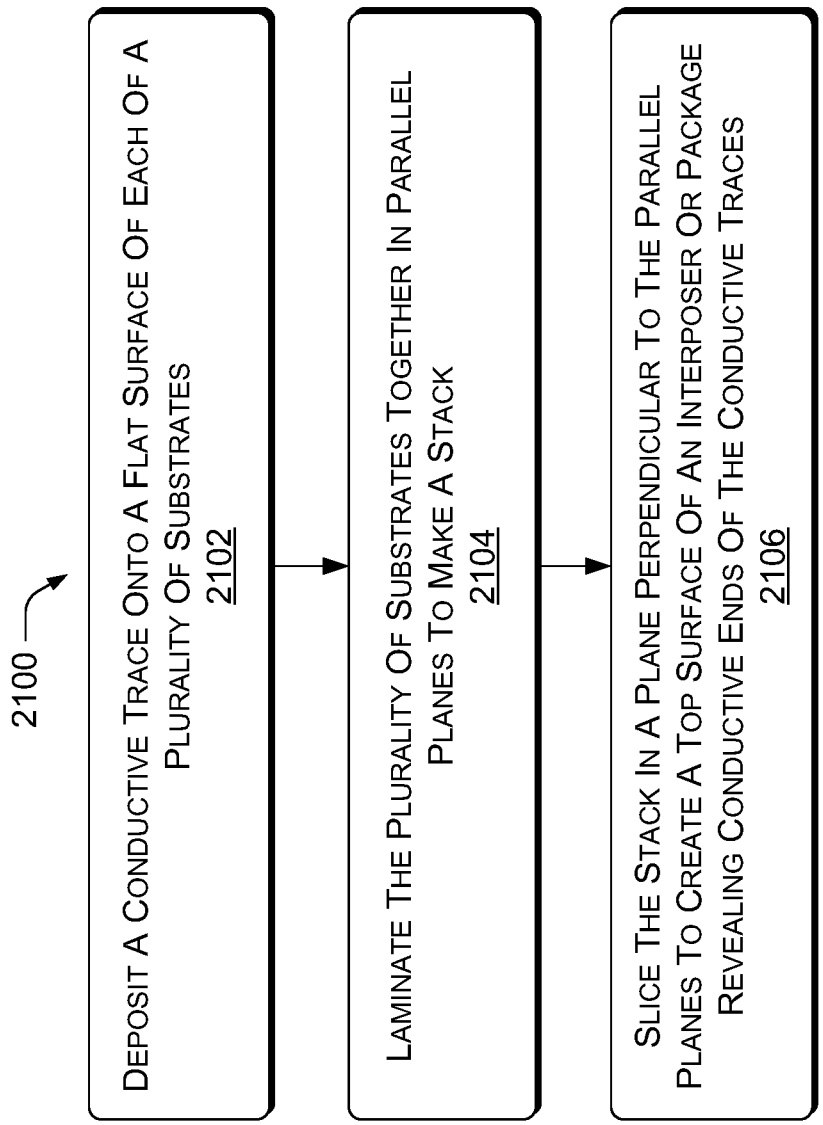
FIG. 21 is a flow diagram of an example method of laminating substrates together to make an example interposer or package.

FIG. 21 shows an example method 2100 of laminating substrates together to make an example interposer or package. In the flow diagram of FIG. 21, the operations of the example method 2100 are shown in individual blocks.

At block 2102, a conductive trace is deposited onto a flat surface of each of a plurality of substrates.

At block 2104, the plurality of substrates is laminated together in parallel planes to make a stack.

At block 2106, the stack is sliced in a plane perpendicular to the parallel planes to create a top surface of an interposer or package. The slice reveals conductive ends of the conductive traces.

Figure 22:
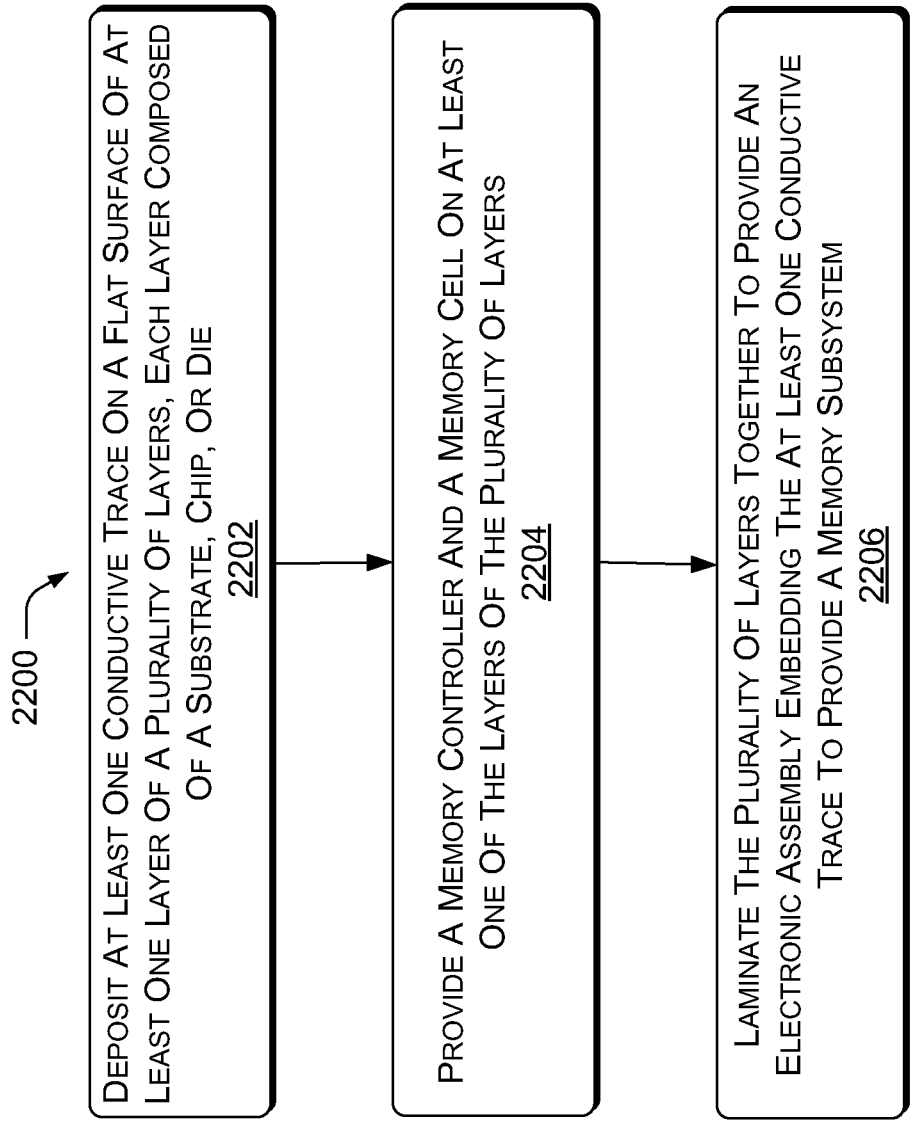
FIG. 22 is a flow diagram of an example method of providing memory components as a layer in a laminated stack for an interposer or package with a memory subsystem.

FIG. 22 shows an example method 2200 of providing memory components as a layer in a laminated stack for an interposer or package to create a memory subsystem. In the flow diagram of FIG. 22, the operations of the example method 2200 are shown in individual blocks.

At block 2202, at least one conductive trace is deposited on a flat surface of at least one layer of a plurality of layers, each layer composed of a substrate, chip, or die.

At block 2204, a memory controller and a memory cell are provided on at least one of the layers of the plurality of layers.

At block 2206, the plurality of layers is laminated together to provide an electronic assembly embedding the at least one conductive trace and providing a memory subsystem.

Figure 23:
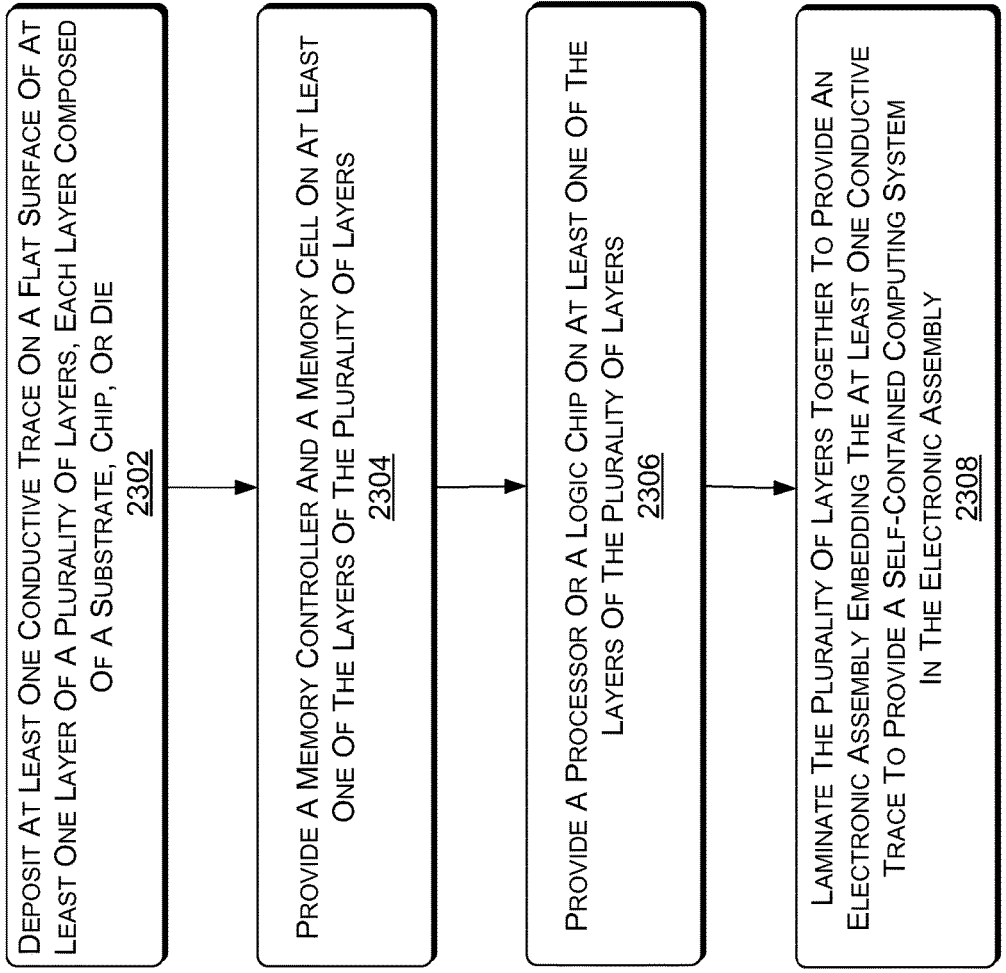
FIG. 23 is a flow diagram of an example method of providing memory components and processor components as layers in a laminated stack for an interposer or package with a self-contained computing device.

FIG. 23 shows an example method 2300 of providing memory components and processor components as layers in a laminated stack to create an interposer or package with a self-contained computing device. In the flow diagram of FIG. 23, the operations of the example method 2300 are shown in individual blocks.

At block 2302, at least one conductive trace is deposited on a flat surface of at least one layer of a plurality of layers, each layer composed of a substrate, chip, or die.

At block 2304, a memory controller and a memory cell are provided on at least one of the layers of the plurality of layers.

At block 2306, a processor or a logic chip is provided on at least one of the layers of the plurality of layers.

At block 2308, the plurality of layers is laminated together to provide an electronic assembly embedding the at least one conductive trace and providing a self-contained computing system in the electronic assembly.

Figure 24:
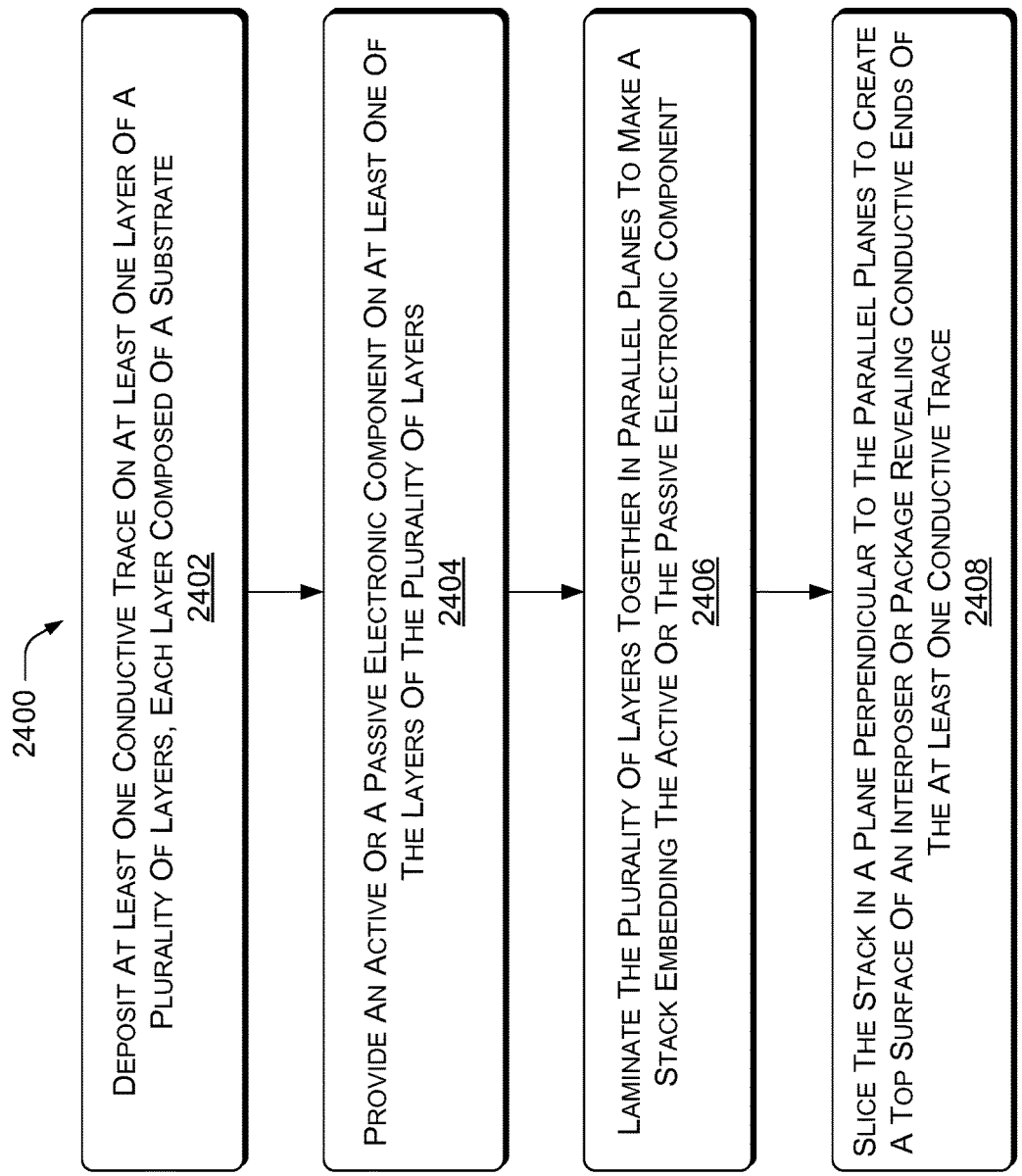
FIG. 24 is a flow diagram of an example method of providing an active or a passive component on a layer of a laminated stack for embedding within an interposer or package.

FIG. 24 shows an example method 2400 of embedding an active or a passive component on a layer of a laminated stack for an interposer or package. In the flow diagram of FIG. 24, the operations of the example method 2400 are shown in individual blocks.

At block 2402, at least one conductive trace is deposited on at least one layer of a plurality of layers, each layer composed of a substrate.

At block 2404, an active or a passive electronic component is provided on at least one of the layers of the plurality of layers.

At block 2406, the plurality of layers is laminated together in parallel planes to make a stack embedding the active or the passive electronic component.

At block 2408, the stack is sliced in a plane perpendicular to the parallel planes to create a top surface of an interposer or package revealing conductive ends of the at least one conductive trace.

Figure 25:
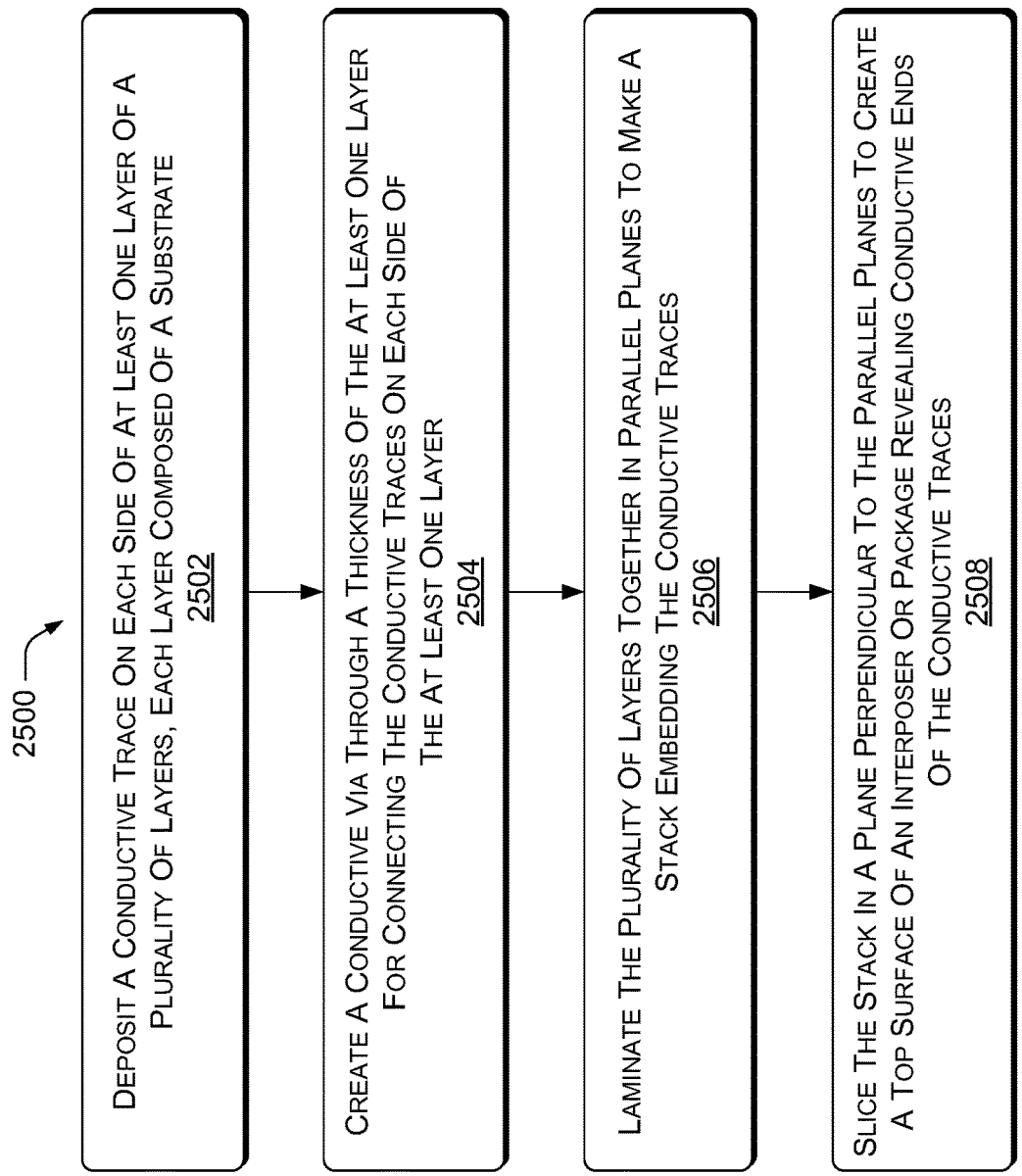
FIG. 25 is a flow diagram of an example method of creating a conductive via through a thickness of a layer of a laminated stack, for connecting conductors on different layers of the laminated stack.

FIG. 25 shows an example method 2500 of creating a conductive via through a thickness of a layer of a laminated stack to connect conductors of different layers. In the flow diagram of FIG. 25, the operations of the example method 2500 are shown in individual blocks.

At block 2502, a conductive trace is deposited on each side of at least one layer of a plurality of layers, each layer composed of a substrate.

At block 2504, a conductive via is created through a thickness of the at least one layer for connecting the conductive traces on each side of the at least one layer.

At block 2506, the plurality of layers is laminated together in parallel planes to make a stack embedding the conductive traces.

At block 2508, the stack is sliced in a plane perpendicular to the parallel planes to create a top surface of an interposer or package, revealing conductive ends of the conductive traces.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method, comprising:
  depositing conductive traces of a circuit on a planar surfaces of multiple wafers, including partitioning the circuit for each wafer into panes, each partition suitable for a pane and laying out the partitions of the circuit on successive panes of multiple wafers;
  dicing the wafer and the conductive traces of the circuit to make panes;
  stacking the panes to create a laminated stack of the panes;
joining the panes together, the joining comprising at least silicon dioxide to silicon dioxide joining;
  conductively connecting ends of the conductive traces of the panes to complete the circuit within the panes of the laminated stack;
  forming a capacitor within the laminated stack by reserving respective areas of the conductive traces on the successive layers as capacitor plates interleaved with a dielectric of the laminated panes;
  connecting an active die to at least some of the conductive traces of the successive layers of the laminated stack with inter-laminate through-substrate-vias inside the laminated stack;
and
  disposing the laminated stack as an interposer in a microelectronics package.

2. The method of claim 1, further comprising building at least one a redistribution layer (RDL) on the conductively connected ends of the conductive traces at the one of more sides of the laminated stack.

3. The method of claim 1, further comprising electrically coupling conductive traces of adjacent panes in the laminated stack with inter-laminate through-substrate-vias inside the laminated stack.

4. The method of claim 1, further comprising thinning the panes to dispose the conductive traces at a lead spacing of a die.

5. The method of claim 1, further comprising direct-bonding leads of a die to the conductive traces at the edges of the panes.

6. The method of claim 1, further comprising depositing the conductive traces of a single circuit on the planar surface of the substrate; and
  after dicing the substrate into the panes and stacking the panes to create the laminated stack, conductively connecting the ends of the conductive traces of the panes to restore the single circuit within the panes of the laminated stack.

7. The method of claim 1, further comprising orienting the laminated stack on edge in the microelectronics package to dispose the conductive traces of the circuit as vertical layers.

8. The method of claim 7, further comprising depositing second conductive traces on the planar surface of the substrate in addition to the conductive traces of the circuit, wherein after the dicing the substrate to make the panes and stacking the panes to make the laminated stack, the second conductive traces become vertical interconnects in addition to the circuit when the laminated stack is oriented on edge in the microelectronics package.

\* \* \* \* \*